(12) United States Patent
Jou et al.

(10) Patent No.: US 12,000,030 B2
(45) Date of Patent: *Jun. 4, 2024

(54) COPPER ALLOY FILM WITH HIGH STRENGTH AND HIGH CONDUCTIVITY

(71) Applicant: Apple Inc., Cupertino, CA (US)

(72) Inventors: Herng-Jeng Jou, San Jose, CA (US); Jacob L. Smith, Sunnyvale, CA (US); Weiming Huang, State College, PA (US)

(73) Assignee: APPLE INC., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/661,695

(22) Filed: May 2, 2022

(65) Prior Publication Data

US 2022/0356546 A1    Nov. 10, 2022

Related U.S. Application Data

(60) Provisional application No. 63/185,679, filed on May 7, 2021.

(51) Int. Cl.
*C22C 9/00* (2006.01)
*C23C 14/14* (2006.01)
(Continued)

(52) U.S. Cl.
CPC ............... *C22C 9/00* (2013.01); *C23C 14/14* (2013.01); *C23C 14/34* (2013.01); *C25D 3/38* (2013.01);
(Continued)

(58) Field of Classification Search
CPC ... C22C 9/00; C22C 2200/00; C22C 2200/04; C23C 14/14; C23C 14/34; C23C 14/165; C23C 14/205; C23C 14/3464; C23C 14/5806; C25D 3/38; C25D 1/04; C25D 3/58; C25D 5/022; C25D 5/617; C25D 7/00; C25D 7/04; C25D 7/0621; C25D 17/00; H01M 4/662; H01M 10/0525; H01M 2004/021; H01M 4/661; H01M 4/667;
(Continued)

(56) References Cited

U.S. PATENT DOCUMENTS

2013/0136650 A1   5/2013   Li et al.
2014/0217593 A1*  8/2014   Chen .................. B23K 1/0016
                                                    257/762
2015/0275350 A1   10/2015  Ott et al.

FOREIGN PATENT DOCUMENTS

CN       1498987 A       5/2004
CN     103237910 A       8/2013
(Continued)

OTHER PUBLICATIONS

CN112030030A, Zhang et al., machine translation. (Year: 2020).*
(Continued)

*Primary Examiner* — John A Hevey
(74) *Attorney, Agent, or Firm* — Dorsey & Whitney LLP

(57) ABSTRACT

A method of forming a component can include electrochemically depositing a metallic material onto a carrier component to a thickness of greater than 50 microns. The metallic material can include crystal grains and at least 90% of the crystal grains can include nanotwin boundaries. The metallic material can include a Copper-Silver alloy (Cu—Ag) with between about 0.5-2 at %-Ag.

14 Claims, 36 Drawing Sheets

(51) Int. Cl.
  *C23C 14/34* (2006.01)
  *C25D 3/38* (2006.01)
  *H01M 4/02* (2006.01)
  *H01M 4/66* (2006.01)
  *H01M 10/0525* (2010.01)

(52) U.S. Cl.
  CPC ....... *H01M 4/662* (2013.01); *H01M 10/0525* (2013.01); *C22C 2200/00* (2013.01); *H01M 2004/021* (2013.01)

(58) Field of Classification Search
  CPC ........ H01M 4/668; B82Y 30/00; B82Y 40/00; H01R 13/02; H01R 31/06
  See application file for complete search history.

(56) References Cited

FOREIGN PATENT DOCUMENTS

| | | | | |
|---|---|---|---|---|
| CN | 112030030 A | * | 12/2020 | ............... C22C 1/02 |
| CN | 112030030 A | | 12/2020 | |
| GB | 201918029 | | 1/2020 | |

OTHER PUBLICATIONS

Zhao et al., "The effect of nanotwins on the corrosion behavior of copper," Acta Materialia, 67 (2014), pp. 181-188 (Year: 2014).*
Course of College Physics Experiments, p. 305.

* cited by examiner

COPPER ALLOY FILM WITH HIGH STRENGTH AND HIGH CONDUCTIVITY

CROSS-REFERENCE TO RELATED APPLICATION(S)

This claims the benefit of U.S. Provisional Patent Application No. 63/185,679, filed May 7, 2021, entitled "COPPER ALLOY FILM WITH HIGH STRENGTH AND HIGH CONDUCTIVITY," the entire disclosure of which is hereby incorporated by reference.

FIELD

The described embodiments relate generally to electronic device components. More particularly, the present embodiments relate to components including nanotwinned metals.

BACKGROUND

Recent technological advances have enabled manufactures to include a large number of operational components, such as processors, antennas, displays, cameras, haptic feedback components, and batteries, in a relatively small internal volume defined by a housing or enclosure of a portable electronic device. Due to the drive for thinner and smaller electronic devices, the internal volume of the device can be relatively small and can include a number of operational components in close proximity with one another. Further, the increasing performance levels of these components can require greater amounts of power to be delivered to the components in shorter amounts of time.

In use, the levels of electrical resistance and thermal conductivity in these operational components, and in circuits including these operational components, can result in the generation of heat or thermal energy that can cause the components themselves, as well as any other components nearby, to experience elevated operating temperatures. These elevated operating temperatures can reduce device performance and can result in undesirable levels of stress on the device components. Accordingly, it can be desirable to reduce the electrical resistance and increase the thermal conductivity of operational components and circuits to allow for high levels of current to flow without producing undesirably high levels of heat or thermal hotspots.

Traditionally, metal alloys have been included in the materials forming these operational components and circuits that seek to reduce the electrical resistance of the materials. This approach can result in materials that have a relatively low resistance, but that also have a relatively low mechanical strength. Similarly, techniques to increase the mechanical properties of the materials of operational components and circuits can result in materials that have a relatively high electrical resistance. Accordingly, it can be desirable to provide materials that have desired levels of electrical resistance and thermal conductivity, while also achieving desired levels of mechanical properties.

SUMMARY

The present disclosure relates generally to electronic devices. In particular, the present disclosure relates to electronic components, materials, and methods of manufacture and use thereof. In one example, the present disclosure includes a method of forming a component that includes depositing a metallic material including crystal grains onto a carrier, with one or more of the crystal grains including nanotwin boundaries, wherein the metallic material comprises a copper (Cu)-silver(Ag) alloy comprising between 0.5-2 at %-Ag.

In one example, the method can include depositing metallic material that includes co-sputtering the metallic material. Also, the method can include electroplating the material. In one example, the carrier of the method includes a conductive material. In one example, the carrier of the method includes a metallic drum. In another example, the carrier of the method includes a conductive mandrel having a shape corresponding to a shape of the component. In yet another example, the carrier is at least partially immersed in an electrolyte solution comprising cations of the metallic material and a suppressor agent.

In one example of the present disclosure, a stock material includes a metallic material including crystal grains, the metallic material comprising a Cu—Ag alloy with between 0.5-2 at %-Ag, and at least 90% of the crystal grains include nanotwin boundaries.

In one example, the metallic material of the stock material includes a continuous sheet having a length of at least 2 cm. In another example of the stock material, the crystal grains have an average spacing between nanotwin boundaries of between 2 and 5 nanometers (nm). In yet another example of the stock material, at least 95% of the crystal grains include nanotwin boundaries. In another example of the stock material, a thickness of the metallic material is greater than 50 microns.

In another example of the present disclosure, an electronic device includes a conductive component having a metallic alloy material including crystal grains, the metallic alloy material including a copper (Cu)-silver(Ag)alloy with between 0.5-2 at %-Ag, and at least 90% of the crystal grains include nanotwin boundaries.

In one example of the electronic device, the conductive component is an electrically conductive component. In another example, the electrically conductive component includes a charging receptacle. In one example, the electrically conductive component includes an electrical connector between two electronic components. In another example, the two electronic components include printed circuit boards. In yet another example, the electrically conductive component includes a battery. In one example of the electronic device, the conductive component is a thermally conductive component. In another example, the thermally conductive component includes a support plate. In one example, the thermally conductive component includes a non-planar shape and mechanically supports a component affixed to the thermally conductive component.

In another example disclosed in the present disclosure, a battery includes an electrochemical cell having an electrolyte, an anode, and a cathode and a current collector electrically coupled to one of the anode or the cathode, the current collector including a metallic alloy material including crystal grains, at least 90% of the crystal grains including nanotwin boundaries, the metallic alloy material including at least one of copper (Cu) or silver (Ag).

In one example of the battery, the metallic alloy material includes a Cu—Ag alloy with between 0.5-2 at %-Ag. In another example, the metallic alloy material has a thickness of less than 10 microns. In one example, the electrochemical cell is a lithium-ion electrochemical cell.

In one example, the present disclosure includes a method of forming a component that includes electroplating a metallic material including crystal grains onto a carrier, with one or more of the crystal grains including nanotwin boundaries. In one example, the metallic material includes a copper (Cu)-cobalt (Co) alloy and the carrier is at least partially immersed in an electrolyte solution including between about 0.1 M and about 0.5 M $CoSO_4$.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1A:
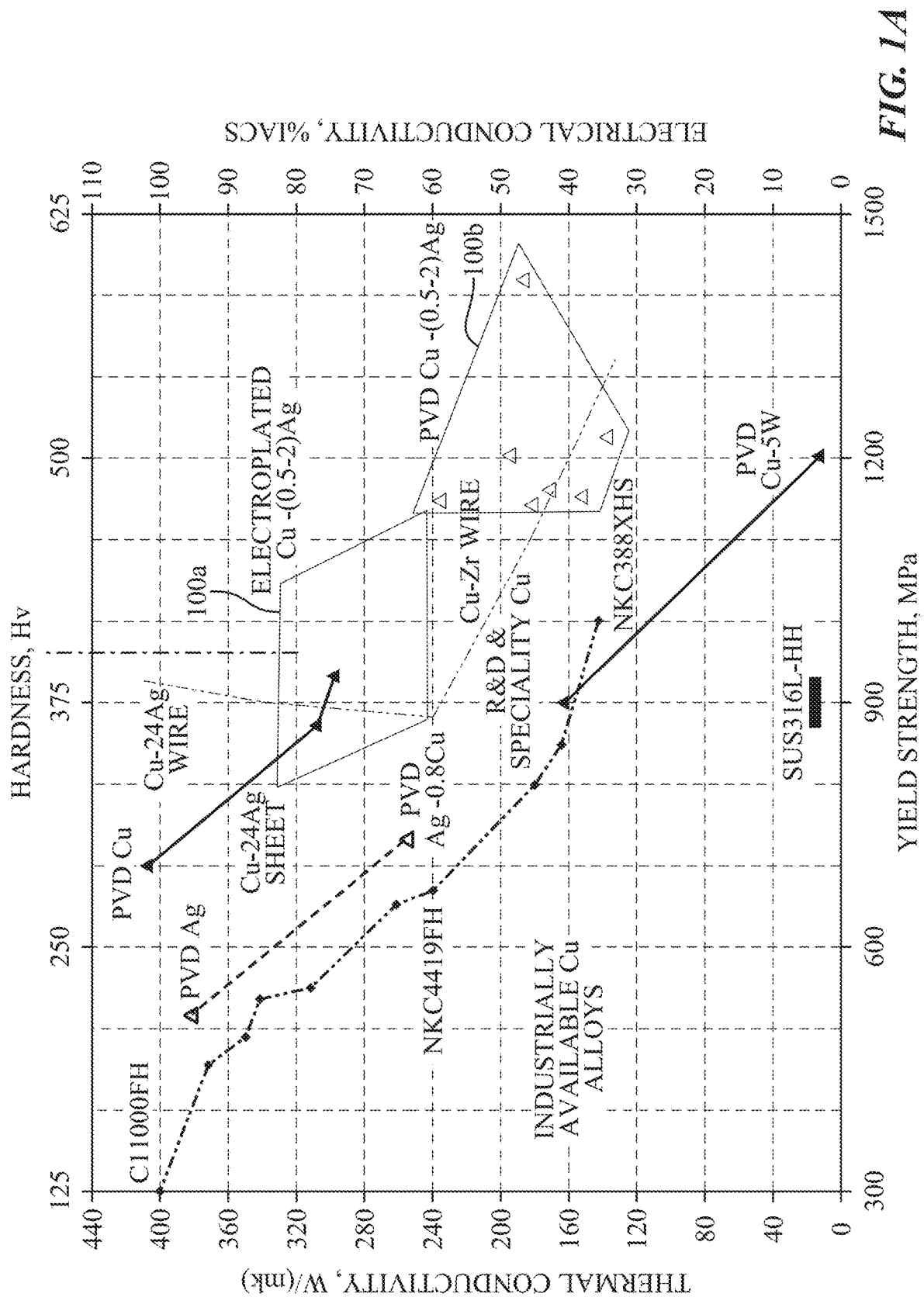
FIG. 1A shows a plot of thermal and electrical conductivity versus yield strength and hardness for various metallic materials.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments, as defined by the appended claims.

In some examples, a metallic material can include crystal grains, and at least 90% of the crystal grains can have nanotwin boundaries therein. Also, the metallic material can include a copper (Cu) and silver (Ag) alloy with between about 0.5-2 atomic percent (at %) of Ag. The nanotwin boundaries can be spaced apart from one another within the crystal grains by between about 2 nanometers (nm) and about 5 nm. According to some examples, a battery can include multiple lithium-ion electrochemical cells that each have an anode, a cathode, a separator, and an electrolyte. Conductive current collectors can be electrically coupled to the anode and the cathode of each cell. A nanotwinned metallic material, such as nanotwinned metallic copper foil having a thickness greater than about 50 microns, can serve as the current collectors, and the active materials of the anode and/or cathode can be deposited onto the nanotwinned metallic foil to form the anode and/or cathode.

Typically, in electronic components that demand high levels of electrical and thermal conductivity, pure metallic materials having naturally high bulk electrical and thermal conductivities, such as copper or silver, can be used. In some applications, however, it can also be desirable for these high conductivity materials to have high levels of other material properties, such as a high strength that can allow the materials to provide mechanical support or have other functionalities in an electronic component or device.

For example, pure copper has an extremely high thermal conductivity and electrical conductivity, thereby allowing for the highly efficient transmission of heat or electronic power or signals through the material. The yield strength of copper, however, is relatively low and it can be difficult to achieve desired levels of mechanical strength in components including pure copper. Alloying elements within copper can increase strength but generally reduce the thermal and electrical conductivity of the copper material. Thus, depending on the use case of the material, a balance must be struck between the amount and type of alloying elements added to pure copper to obtain sufficient thermal and electrical conductivity as well as material hardness and yield strength for a specific application.

In addition to utilizing alloying elements within copper or other conductive metals, it can be desirable to use a material in electronic components that has a crystal structure with features that impede the movement of dislocations, but that do not impede the flow of electrons. One such feature is known as a twin boundary. A twin boundary occurs when two crystals, for example, two regions of a crystal grain of a metallic material, share the same crystal lattice points in a symmetrical, but non-identical manner. These twin boundaries can impede dislocation movement, resulting in increased material strength, but because the same crystal lattice points are shared along the boundary, the twin boundary has essentially no effect on the conduction of thermal or electrical energy across the boundary. Typically, metallic materials do not include a high percentage of twin boundaries. In some examples, however, and as described herein, metallic materials can be formed that include a high percentage of twin boundaries, with a large number of the crystal grains of the material including multiple twin boundaries, and with the boundaries themselves being separated by distances on the order of tens or hundreds of nanometers (nm). These materials can be referred to as nanotwinned materials, nanotwinned metals, and/or nanotwinned alloys, while the boundaries themselves, when separated by distances on the order of nanometers, can be referred to as nanotwin boundaries.

In the examples of materials described herein, it can be advantageous to combine the added material strength and hardness advantages of alloying elements with the nanotwin boundaries described above, which promote strength and hardness with minimal loss to the thermal and electrical conductivity of the material. Such materials, referred to herein as "nanotwinned metallic alloy materials," can allow for new component and device designs that take advantage of these improved material properties.

The manufacture of large amounts or volumes of nanotwinned metallic alloy materials, such as nanotwinned Cu—Ag alloys, for example, in rolls having thicknesses of greater than 50 um, can allow for nanotwinned metallic alloy materials to replace existing metallic materials and alloys in component and device manufacturing processes without the need for significant or costly modifications. In some examples, and as described herein, nanotwinned metallic alloy materials can be co-sputtered in a PVD process, electrodeposited, or electroformed in a desired shape and to a desired thickness, for example, greater than about 50 microns and up to several millimeters. In some examples, foils or films of nanotwinned metallic alloy materials can be formed by reel to reel or conductive barrel electrodeposition processes. Further, electroforming nanotwinned Cu—Ag alloys or other nanotwinned metallic alloy materials allows for formation of complex parts that can have well-defined edges and features, but that can be formed into shapes that can otherwise require techniques such as deep drawing to produce, such techniques typically resulting in less well-defined edges and features and increasing post-processing costs or reducing component performance.

The improved material properties, such as strength, hardness, electrical conductivity, and thermal conductivity of nanotwinned metallic alloy materials relative to non-nanotwinned and/or non-alloyed metallic materials can also allow for new component and device designs that take advantage of these improved material properties. For example, components that conduct or transmit electrical power can have smaller dimensions because the mechanical strength of the metallic portions of these components may no longer constrain the design. Further, the high levels of electrical conductivity provided by nanotwinned metallic alloy materials can allow for highly efficient power or signal transmission, even though these components having reduced dimensions. The use of highly conductive nanotwinned metallic alloy materials in multiple components or locations along an electronic device's charging pathway, for example, can result in compounding efficiencies that allow for reduced charging times, increased battery life, and other advantages, as described herein.

These and other embodiments are discussed below with reference to FIGS. 1A-20C. However, those skilled in the art will readily appreciate that the detailed description given herein with respect to these Figures is for explanatory purposes only, and should not be construed as limiting.

FIG. 1A shows a plot of thermal and electrical conductivity versus yield strength and hardness for various metallic materials. Three important design properties for materials that form components of electronic devices, especially those components which require or transmit power or signals, are yield strength, thermal conductivity, and electrical conductivity. As can be seen in FIG. 1A, a material's yield strength correlates with its hardness. A metallic material's thermal conductivity also typically correlates with its electrical conductivity. Without being bound by any one theory, this can be because similar physical mechanisms are responsible for the thermal and electrical conductivity of a material. While it is desirable for the materials forming electronic components to have high thermal and electrical conductivities and high yield strengths, as can be seen in FIG. 1A, the thermal and electrical conductivity of a material tends to decrease as the hardness or yield strength of the material increases.

FIG. 1A shows the thermal conductivity, electrical conductivity, hardness, and yield strength for one such material, nanotwinned copper-silver (Cu—Ag) alloy 100a, 100b. Two regions 100a, 100b are identified in FIG. 1A to illustrate Cu—Ag alloys formed using two different processes because the process used to form nanotwinned Cu—Ag alloys can result in different thermal conductivities, electrical conductivities, hardness, and yield strengths of the alloy. For example, these material properties of a nanotwinned Cu—Ag alloy formed by physical vapor deposition (PVD) processes 100a, such as co-sputtering, may be different than the properties of Cu—Ag alloys formed by electroplating processes 100a.

In either case 100a, 100b, as can be seen, the nanotwinned Cu—Ag alloy has levels of thermal and electrical conductivity that are relatively close to pure copper, while having a hardness and yield strength that is significantly higher and is equivalent to alloyed materials that have much lower electrical and thermal conductivities. This desirable combination of material properties can allow for components that are highly efficient at providing or transmitting thermal or electrical power or signals, and that can also be designed to carry or withstand relatively large mechanical loads, support other components, or otherwise serve structural functions. The combination of high strength and high conductivity means that relatively smaller amounts of nanotwinned metal alloys, such as the nanotwinned Cu—Ag alloys described herein, can be used to achieve desired levels of conductivity, while ensuring that this reduced amount of material or component size does not result in a component that is too weak to withstand the rigors of typical use.

In some examples, the nanotwinned metallic alloy materials described herein can include copper, silver, cobalt, alloys of copper and cobalt, and/or alloys of copper and silver. For example, a nanotwinned metallic alloy materials, for example Cu—Ag alloys, can include between 0.25 atomic % (at %) and 2 at % Ag, for example between 0.5 at % and 2 at % Ag, as shown in the examples given in FIG. 1. In at least one example, nanotwinned metallic alloy materials can include above 2 at % Ag, for example at least 2.5 at % Ag, at least 3 at % Ag, at least 3.5 at % Ag, and at least 4 at % Ag. In general, the stated at % of Ag within the nanotwinned metallic alloy materials described herein can be chosen to achieve the advantageous electrical and thermal conductivity, as well as material strength and hardness, for electronic component applications described in further detail below. Additionally, a nanotwinned Cu—Ag alloy can include the at % of Ag described above, and the balance of the alloy can be Cu, excluding any impurities. In some examples, a nanotwinned Cu—Ag alloy can include the at % of Cu described above and the balance of the alloy can be Ag, excluding any impurities. In some examples, a Cu, Ag, and/or Cu—Ag alloy can include less than about 5 at %, less than about 2 at %, less than about 1 at %, less than about 0.1 at %, or less than about 0.01 at % impurity elements. The term impurities, or impurity elements can be used herein to refer to any element or elements that are not Cu or Ag.

Accordingly, in some examples, nanotwinned Cu—Ag alloys, as described herein, can have a yield strength of greater than about 800 megapascals (MPa). In some examples, nanotwinned Cu—Ag alloys can have a yield strength between about 800 MPa and about 1500 MPa. For example, nanotwinned Cu—Ag alloys can have a yield strength of greater than about 900 MPa, greater than about 1000 MPa, greater than about 1100 MPa, greater than about 1200 MPa, greater than about 1300 MPa, greater than about 1400 MPa, or greater than about 1500 MPa, or more.

In some examples, nanotwinned Cu—Ag alloys, as described herein, can have a Vickers Pyramid Number (Hv) or hardness of greater than about 330. In some examples, nanotwinned Cu—Ag alloys can have a hardness between about 330 Hv and about 625 Hv. For example, nanotwinned Cu—Ag alloys can have a yield strength of greater than about 330 Hv, greater than about 400 Hv, greater than about 450 Hv, greater than about 500 Hv, greater than about 550 Hv, greater than about 600 Hv, or greater than about 625 Hv, or more.

In some examples, nanotwinned Cu—Ag alloys, as described herein, can have an electrical conductivity of greater than about 30% of the International Annealed Copper Standard value (% IACS). In some examples, nanotwinned Cu—Ag alloys can have an electrical conductivity of between about 30% IACS and about 85% IACS. For example, nanotwinned Cu—Ag alloys can have an electrical conductivity of greater than about 30% IACS, greater than about 40% IACS, greater than about 50% IACS, greater than about 60% IACS, greater than about 70% IACS, greater than about 80% IACS, greater than about 85% IACS, or greater than about 90% IACS, or more.

In some examples, nanotwinned Cu—Ag alloys, as described herein, can have a thermal conductivity of greater than about 120 watts per meter-kelvin (W/mK). In some examples, nanotwinned Cu—Ag alloys can have a thermal conductivity of between about 120 W/mK and about 360 W/m·K. For example, nanotwinned Cu—Ag alloys can have a thermal conductivity of greater than about 120 W/mK, greater than about 160 W/mK, greater than about 200 W/mK, greater than about 240 W/mK, greater than about 280 W/mK, greater than about 320 W/mK, or greater than about 360 W/mK, or more.

In some examples, nanotwinned Cu—Ag alloys, as described herein, can have an average grain size of between 0.05 microns and 5 microns, between 0.1 microns and 1 micron, between 0.2 microns and 0.8 microns, between 0.3 microns and 0.7 microns, or between 0.4 microns and 0.6 microns, for example about 0.5 microns.

In some examples, nanotwinned Cu—Ag alloys, as described herein, can have an elongation of between 0.1% and 10%, between 0.5% and 5%, or between 1% and 4%, for example about 2% or about 3%. In some examples, however, nanotwinned Cu—Ag alloys, as described herein, can have an elongation of greater than 10%, for example about 12%, 15%, 17%, or greater.

In some examples, nanotwinned Cu—Ag alloys, as described herein, can include a relatively low percentage of contaminant atoms or elements. As used herein, the term contaminant element can refer to any element other than copper and/or silver, such as sulfur. In some examples, nanotwinned Cu—Ag alloys can include less than 100 parts per million (ppm) of sulfur, less than 75 ppm of sulfur, less than 50 ppm of sulfur, less than 25 ppm of sulfur, less than 20 ppm of sulfur, less than 15 ppm of sulfur, less than 10 ppm of sulfur, less than 5 ppm of sulfur, or even less than 1 ppm of sulfur.

Figure 1B:
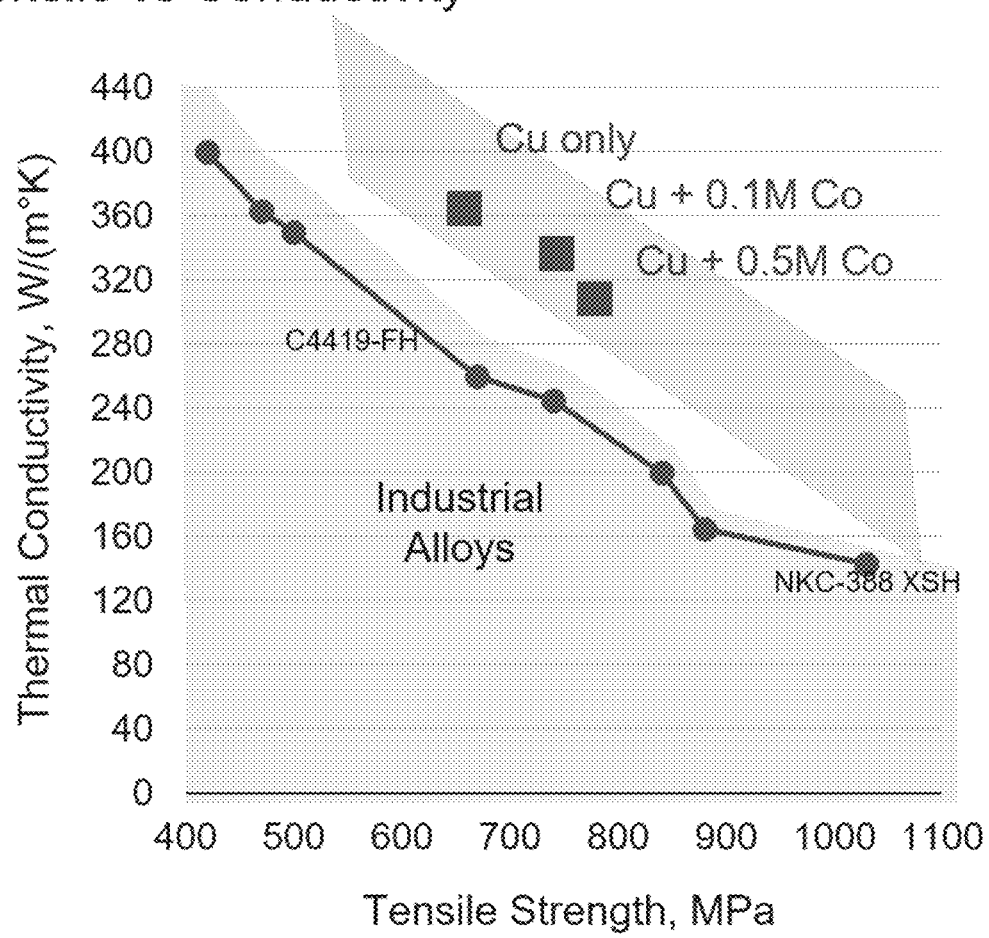
FIG. 1B shows a plot of thermal conductivity versus tensile strength for a nanotwinned metallic alloy material.

FIG. 1B illustrates an exemplary thermal conductivity and tensile strength for a metallic material, including a nanotwinned copper-cobalt (Cu—Co) alloy. In some examples, the manufacturing process of films, foils, and components incorporating such material can include sputtering or electroplating. In some examples, electroplating can include a carrier or substrate at least partially immersed in an electrolyte solution. The electrolyte solution can include an aqueous copper sulfate ($CuSO_4$), an aqueous cobalt sulfate ($CoSO_4$), hydrochloric acid (HCl) and/or a Cheerleader DP-101L additive 20 mL/L. The electrolyte can include approximately 0.06-1.0 M of $CuSo_4$ and between about 0.1 M and about 0.5 M $CoSO_4$. The current density of the electroplating can include between approximately 12 and 18 amperes per square decimeter (ASD). In one example, the electrolyte can include approximately 0.8 M of $CuSo_4$ and between about 0.1 M and about 0.5 M $CoSO_4$. The current density of the electroplating in this example can include about 15 amperes per square decimeter (ASD).

As can be seen in FIG. 1B, the resulting nanotwinned Cu—Co alloy has a level of thermal conductivity relatively close to pure copper. However, the alloy also has a tensile strength that is significantly higher and is similar to other industrial alloyed materials that have much lower thermal conductivities. The combination of material properties provided by the Cu—Co alloy can allow for components that are highly efficient at providing or transmitting thermal or electrical power or signals, and can also be designed to carry or withstand relatively large mechanical loads, support other components, or otherwise serve structural functions. Also, the increased molar concentration of the cobalt in the electrolyte solution decreases the conductivity. As expected, the increased concentration decreases the conductivity with a slope similar to the industrial alloyed materials.

In some examples, the addition of Co to form the Cu—Co alloy can increase the strength without reducing the tensile elongation. In some examples, similar to the Cu—Ag alloys, the nanotwinned Cu—Co alloys, as described herein, can have an elongation of between 0.1% and 10%, between 0.5% and 5%, or between 1% and 4%, for example about 2% or about 3%. In some examples, nanotwinned Cu—Co alloys, as described herein, can have an elongation of greater than 10%, for example about 12%, 15%, 17%, or greater.

In some examples, other nanotwinned metallic alloy materials can be included. Copper-nickel (Cu—Ni) alloys, copper-tin (Cu—Sn) alloys, copper-zinc (Cu—Zn) alloys can also provide the copper alloy film with a high strength and high conductivity, and are suitable for forming a component and/or an electronic device. For further examples and explanations described herein, the present systems and methods are described with reference to nanotwinned Cu—Ag alloys as an exemplary alloy, though the teachings can be equally applied to the other alloys disclosed herein.

In general, nanotwinned metallic alloys, such as nanotwinned Cu—Ag alloys described herein, can be used to create nano-twinned alloy materials having improved strength while only minimally affecting conductivity, as discussed above. To illustrate nano-twinned alloy material characteristics in general, FIGS. 2A-3B illustrate nanotwin structures of a Cu—Ag alloy substrate.

Figure 2A:
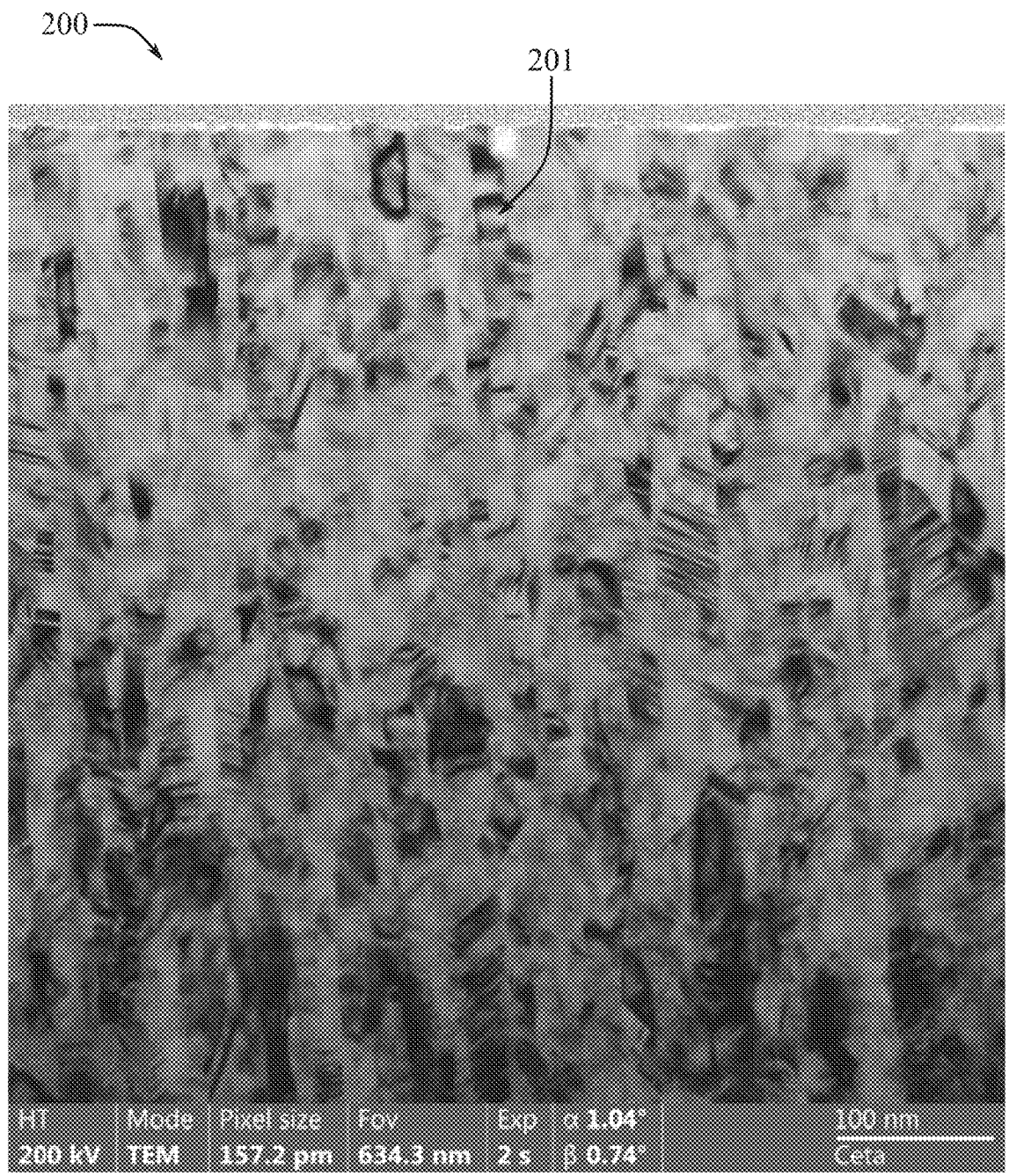
FIG. 2A shows a scanning electron micrograph of a cross-section of a nanotwinned metallic alloy material.

FIG. 2A shows a scanning electron micrograph of a cross-section of nanotwinned Cu—Ag alloy material 200 with an Ag content of about 1.0 at %. Materials and alloys described herein are not limited to the Cu-(1.0)Ag alloy shown in FIG. 2A and may include other ranges of at %-Ag as described elsewhere herein. As described above, a nanotwinned copper-cobalt (Cu—Co) alloy can be included. The nanotwinned Cu—Co alloy is made up of a number of crystal grains. The cobalt refines the grain sizes, which enhances strength of the material. In some examples, the crystal grains including a metallic material that can be relatively uniform in size, or can vary from small to large, depending on how the material was formed and/or treated. In some examples, nanotwinned Cu—Co alloys, as described herein, can have an average grain size of between 0.2 microns and 0.5 microns, between 0.2 microns and 0.4 microns, between 0.2 microns and 0.3 microns. For example, the nanotwinned Cu—Co alloys can have an average grain size of about 0.25 microns.

The nanotwinned Cu—Ag alloy 200 is also made up of a number of crystal grains, such as crystal grain 201 that collectively form the Cu—Ag alloy material 200. In some examples, the crystal grains of a metallic material can be columnar, for example, as shown in FIG. 2A, or can be substantially equiaxial. The crystal grain 201 can be seen to have a regular repeating striped pattern, which is due to the presence of repeating twin boundaries, or nanotwins, as described herein. In at least one example, crystal grains 201 can be columnar grains that are about 5-80 nm wide, or between about 10-50 nm wide, for example between about 20-60 nm wide. In one example, the inclusion of cobalt to form the Cu—Co alloy material disrupts the crystal orientation of the grains, which increases ductility.

In some examples, substantially all or 100% of the crystal grains of a metallic material can include multiple nanotwins. In some examples, greater than 50%, greater than 60%, greater than 70%, greater than 75%, greater than 80%, greater than 85%, greater than 90%, greater than 91%, greater than 92%, greater than 93%, greater than 94%, greater than 95%, greater than 96%, greater than 97%, greater than 98%, or greater than 99%, or more of the crystal grains of a metallic material can include multiple nanotwins.

Figure 2B:
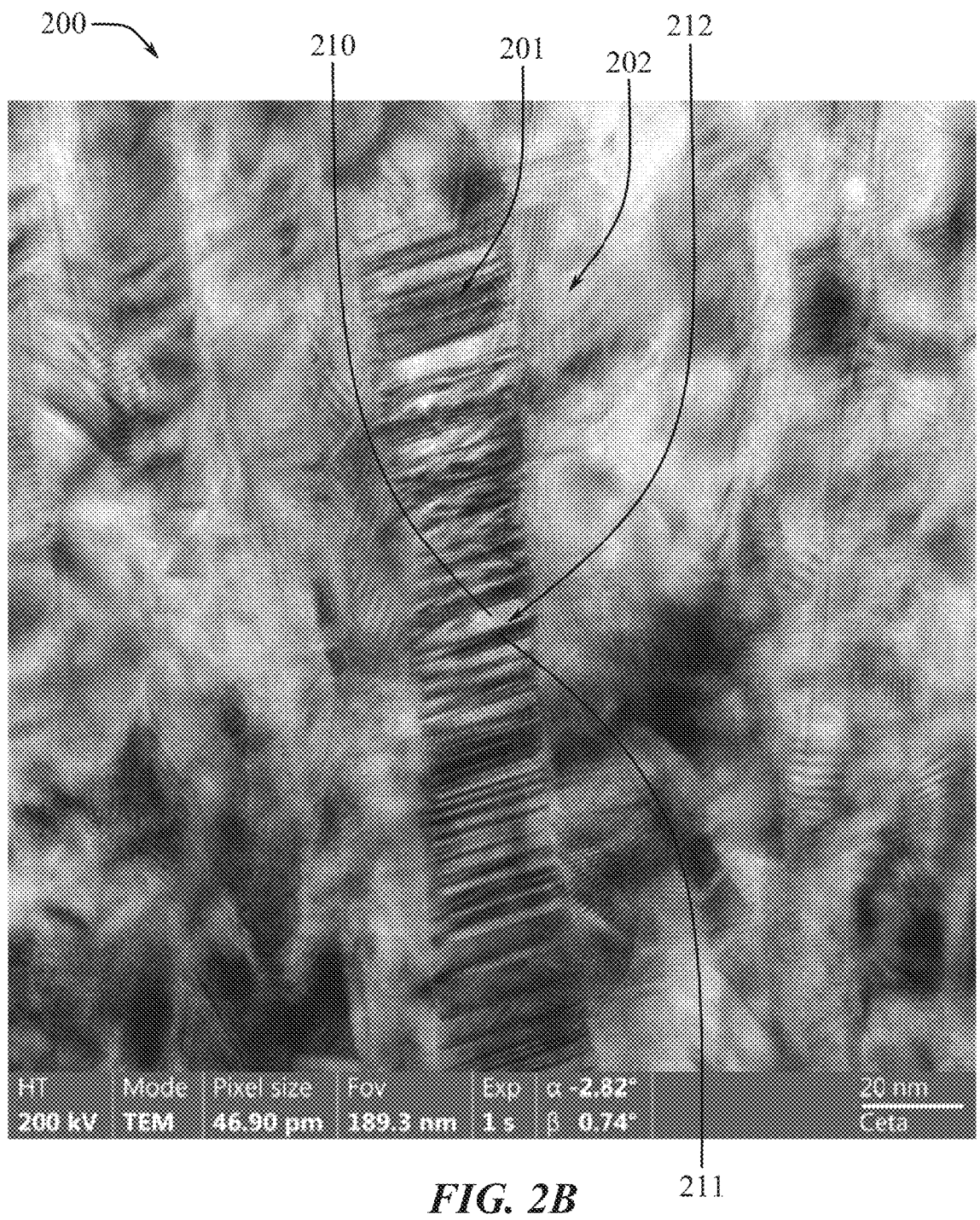
FIG. 2B shows a scanning electron micrograph of a cross-section of a nanotwinned metallic alloy material.

FIG. 2B shows a scanning electron micrograph of portion of the nanotwinned Cu—Ag alloy material 200 shown in FIG. 2A. The micrograph of FIG. 2B is at a higher magnification than the micrograph of FIG. 2A and shows a first crystal grain 201 and a second, adjacent crystal grain 202. The first crystal grain 201 includes a number of twin boundaries that are spaced apart from one another by between about 2-5 nm. In some examples, the crystal grains of a nanotwinned metal alloy, such as nanotwinned Cu—Ag alloy material 200 described herein, can include twin boundaries spaced apart from one another by less than about 100 nm, less than about 75 nm, less than about 50 nm, less than about 25 nm, less than about 20 nm, less than about 15 nm, less than about 10 nm, less than about 5 nm, or less than about 2 nm or smaller.

For example, the crystal grain 201 includes a twin boundary 212 between a first region 210 of the crystal grain having a first crystal lattice arrangement, here shown in light gray, and a second region 211 of the crystal grain that shares the same lattice points with the first region 210 along the boundary 212. The second region 211, however, has a second, symmetrical crystal lattice arrangement, here shown in dark gray. In some examples, the different crystal lattice arrangements of regions sharing a twin boundary can be conceived of as mirror images of one another.

In some examples, a nanotwinned metallic material, such as the nanotwinned Cu—Ag alloy materials described herein, can have a thickness, when formed, of greater than 1 micron, greater than 10 microns, greater than 25 microns, 50 microns, greater than 75 microns, greater than 100 microns, greater than 125 microns, greater than 150 microns, greater than 200 microns, greater than 250 microns, greater than 500 microns, greater than 1000 microns, 2000 microns, 3000 microns, 5000 microns, or even thicker. Thus, although manufacturing and treatment processes can result in portions of nanotwinned metallic material having a thickness less than those thicknesses described herein, the nanotwinned metallic material can be formed having the described thicknesses.

Figure 3A:
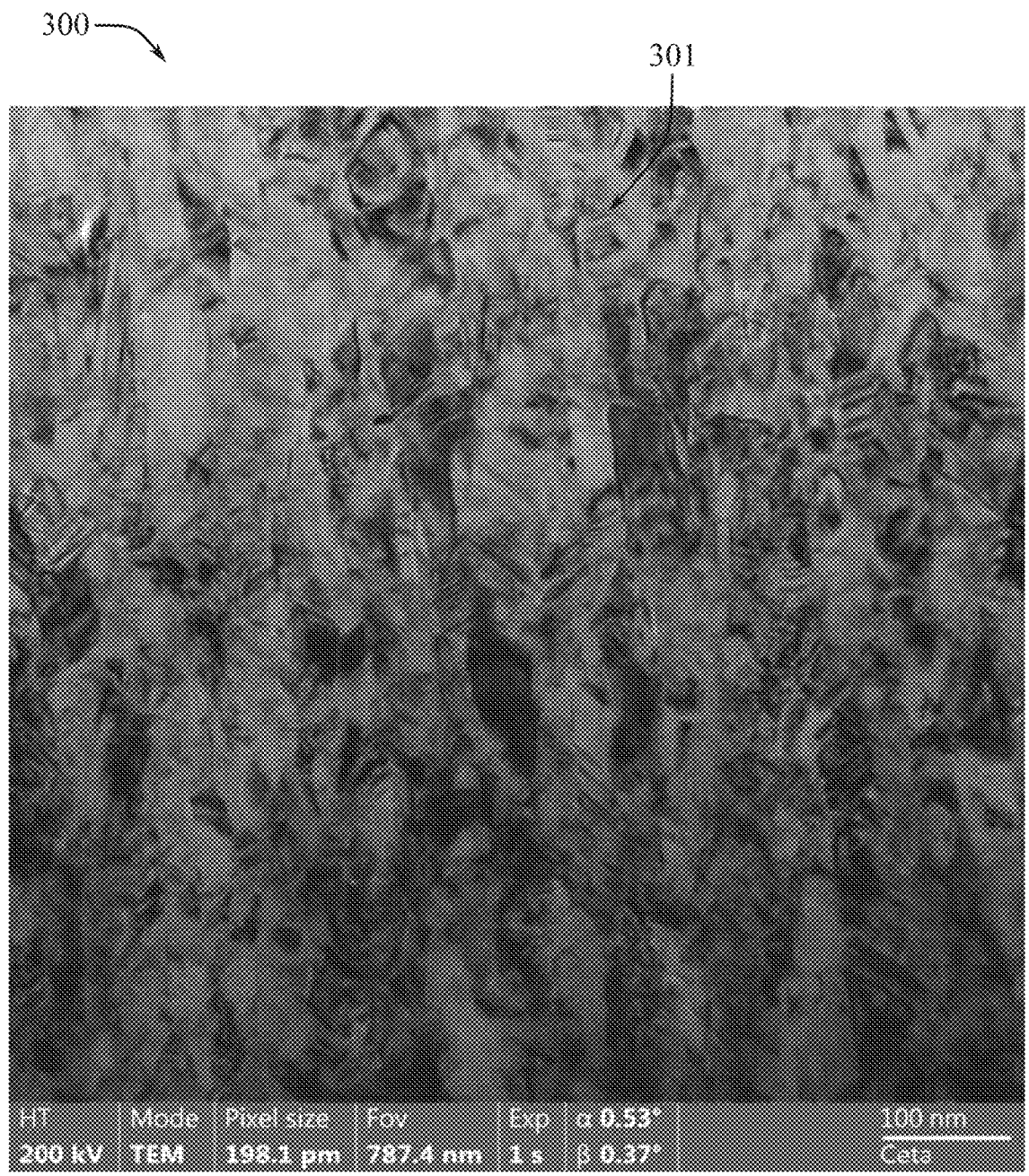
FIG. 3A shows a scanning electron micrograph of a cross-section of a nanotwinned metallic alloy material.

FIG. 3A shows a scanning electron micrograph of a cross-section of nanotwinned Cu—Ag alloy material 300. The nanotwinned Cu—Ag alloy 300 is made up of a number of crystal grains, such as crystal grain 301, which collectively form the nanotwinned Cu—Ag alloy material 300. In some examples, the crystal grains including a metallic material can be relatively uniform in size, or can vary from small to large, depending on how the material was formed and/or treated. In some examples, the crystal grains of a metallic material can be equiaxial or substantially equiaxial. The crystal grain 301 can be seen to have a regular repeating striped pattern, which can be due to the presence of repeating twin boundaries, or nanotwins, as described herein.

Figure 3B:
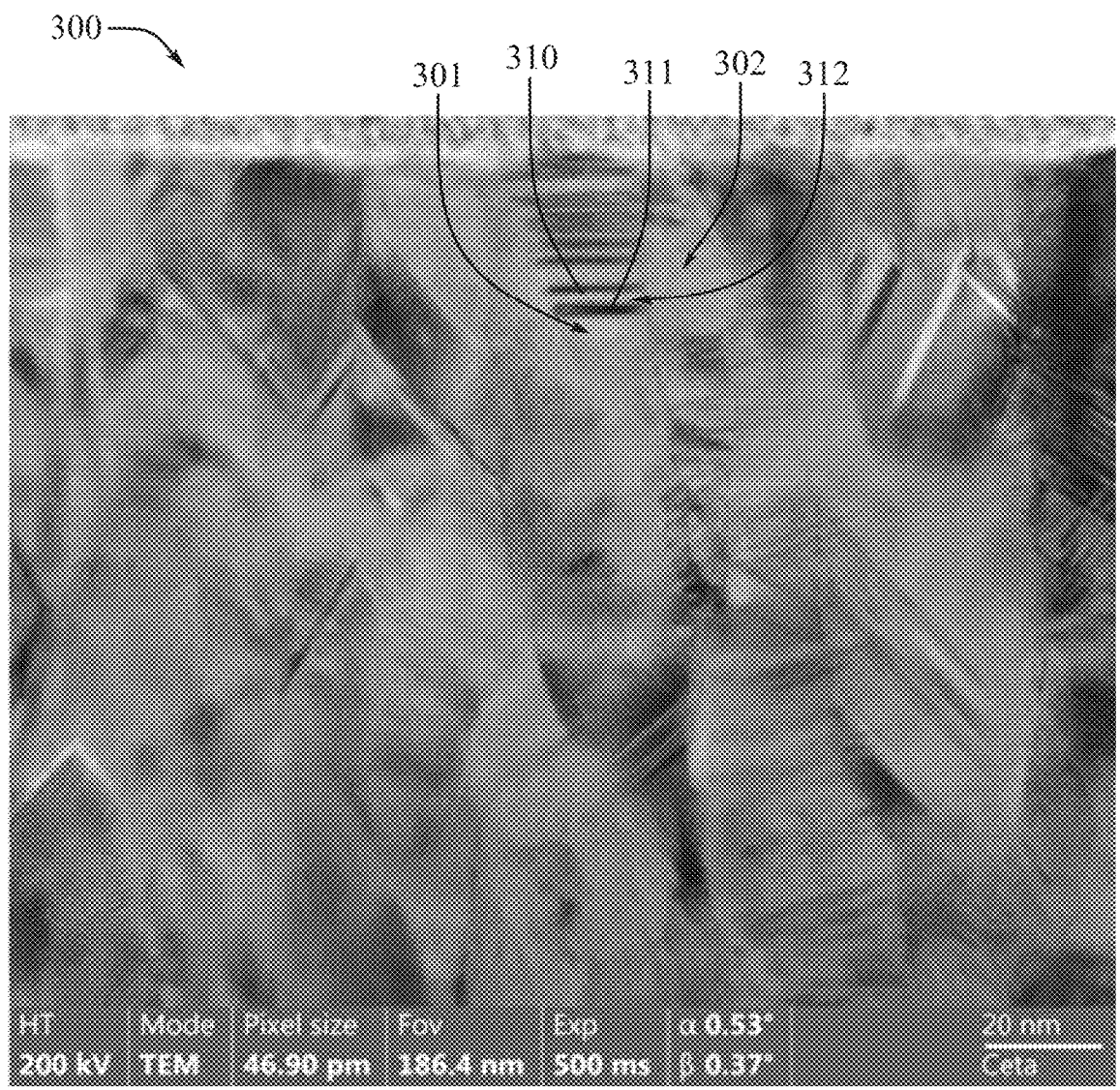
FIG. 3B shows a scanning electron micrograph of a cross-section of a nanotwinned metallic alloy material.

FIG. 3B shows a scanning electron micrograph of portion of the copper material 300 shown in FIG. 3A. The micrograph of FIG. 3B is at a higher magnification than the micrograph of FIG. 3A and shows a first crystal grain 301 and a second, adjacent crystal grain 302. The crystal grain 302 includes a number of twin boundaries that are spaced apart from one another by between about 2-5 nm. In some examples, the crystal grains of a nanotwinned metal alloy, such as nanotwinned Cu—Ag alloy material 200 described herein, can include twin boundaries spaced apart from one another by less than about 100 nm, less than about 75 nm, less than about 50 nm, less than about 25 nm, less than about 20 nm, less than about 15 nm, less than about 10 nm, less than about 5 nm, or less than about 2 nm or smaller.

For example, the crystal grain 302 includes a twin boundary 312 between a first region 310 of the crystal grain having a first crystal lattice arrangement, here shown in light gray, and a second region 311 of the crystal grain that shares the same lattice points with the first region 310 along the boundary 312. The second region 311, however, has a second, symmetrical crystal lattice arrangement, shown in FIG. 3B as a dark gray portion. In some examples, the different crystal lattice arrangements of regions sharing a twin boundary can be conceived of as mirror images of one another. In some examples, and as shown, the crystal grains 301, 302 can have similar shapes or different shapes. For example, the grain 302 is relative equiaxial, being slightly larger in one lateral dimension, while the grain 301 is relatively columnar. The degree to which the grains of the nanotwinned Cu—Ag alloy material 300 are uniformly equiaxial, or a distribution of equiaxial and columnar can be chosen by adjusting the process conditions for forming the nanotwinned Cu—Ag alloy material 300, as described herein.

In some examples, and as described further herein, alternating current, direct current, and/or pulsed direct current can be applied to a deposition cell to form the nanotwinned Cu—Ag alloy material 300. In some examples, one or more variables of the current, including the pulse duration, pause duration, direct current duration, and/or ratio of pulsed current time or number of cycles to direct and/or alternating current time can be selected to control the degree to which the grains of the nanotwinned copper 300 are equiaxial, columnar, and/or a desired amount or distribution of equiaxial and columnar. In the particular example shown in FIGS. 3A-3B, the nanotwinned copper 300 can be formed by a deposition process, as described herein, including direct current pulses of about 5 milliseconds (ms) at about 50 amperes per square decimeter (ASD), with pauses of 20 ms between each pulse.

The nanotwinned Cu—Ag alloy material 200 shown in FIGS. 2A and 2B include an alloy having 1 at %-Ag and nanotwinned Cu—Ag alloy material 300 shown in FIGS. 3A and 3B include an alloy having 0.87 at %-Ag. As noted above, the at % of Ag within alloys described herein can vary. The manufacturing process of films, foils, and components incorporating such materials may also vary, as will be described in more detail below. In general, it is noted here, these processes can include electroplating processes and/or PVD processes. In at least one example, after forming the nanotwinned Cu—Ag alloy materials described herein, the materials can then be subject to an annealing process. For example, the nanotwinned Cu—Ag alloy material 300 shown in FIGS. 3A and 3B were formed using a co-sputtering PVD process followed by annealing while the nanotwinned Cu—Ag alloy material 200 shown in FIGS. 2A and 2B was formed using a co-sputtering PVD process without a subsequent annealing step.

In at least one example, the annealing process used on nanotwinned Cu—Ag alloy material 300 shown in FIGS. 3A and 3B included subjecting the nanotwinned Cu—Ag alloy material 300 to a temperature of 200-Celcius for one hour under protective argon gas. In at least one example, the alloy materials described herein can be subjected to 200-Celcius for up to 5 hours or more. Longer annealing times may result in improved thermal stability of the material.

Figure 4:
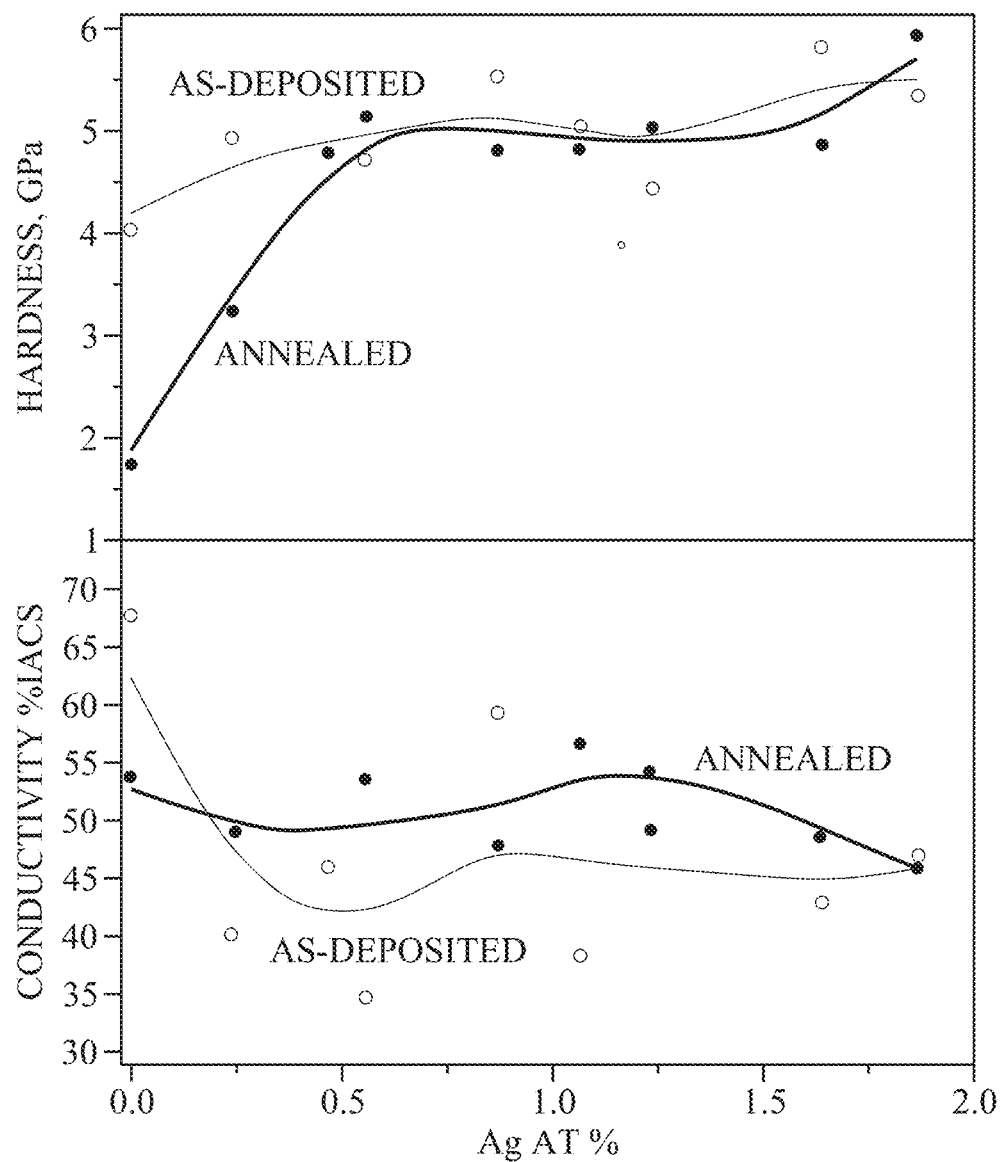
FIG. 4 shows a graph of hardness and conductivity vs. at %-Ag of a nanotwinned metallic alloy material.

Along these lines, FIG. 4 shows a graph of hardness and conductivity vs. the amount of Ag within the alloy material and the effects of annealing. Pure Cu with a fine nano-microstructure is known to coarsen even at room temperature storage, resulting in lower strength. This can be seen in plot of FIG. 4A with a hardness drop for samples with less than 0.5 at %-Ag alloys subjected to a temperature of 200-Celcius for one hour. Also, as shown, the same annealing conditions help stabilize the fine microstructure of alloy materials with greater than 0.5 at %-Ag against coarsening. As shown, annealing at 200-Celcius for one hour does not reduce the hardness for Cu—Ag alloys with greater than 0.5 at %-Ag. In addition, in at least one example, this annealing step can increase conductivity.

As noted above, multiple processes can be used to form foils, films, and components incorporating nanotwinned metallic materials described herein. At least two of these processes can include co-sputtering PVD processes and electroplating processes. Along these lines, FIG. 5 illustrates a schematic diagram of a system 500 for forming a nanotwinned metallic alloy, such as the nanotwinned Cu—Ag alloy materials described herein. In some examples, the system 500 can include a carrier or substrate 512, such as a silicone substrate, disposed with an anode 522 and target materials 514a, 514b, and 514c disposed with corresponding cathodes 516a, 516b, and 516c. In some examples, substrate 512 can take any shape such that metallic films forming thereon within system 500 can form corresponding shapes as needed. In one example, two of the target materials 514a, 514b, and 514c can include Cu targets and one of the target materials 514a, 514b, and 514c can include an Ag target. An inert sputtering gas 518, such as argon, can be used between the cathodes 516a, 516b, 516c and anode 522.

Using such a system, and in at least one example, a target deposition rate of 2-4 nm/s was used to achieve a material thickness of about 600 nm to about 1100 nm. In a first step of co-sputtering process using system 500, a pressure of between about 1.1-15 mTorr was used and Cu targets were powered at between about 250-460 Watts (W) with the Ag target powered at between about 0-15 W. In a second step, a pressure of about 1.1 mTorr was used and Cu targets were powered at between about 300-430 Watts (W) with the Ag target powered at between about 0-15 W. In at least one example, these steps using a system similar to system 500 can produce a set of nanotwinned Cu—Ag alloy material samples with between 0-2 at %-Ag in the alloy.

Figure 5A:
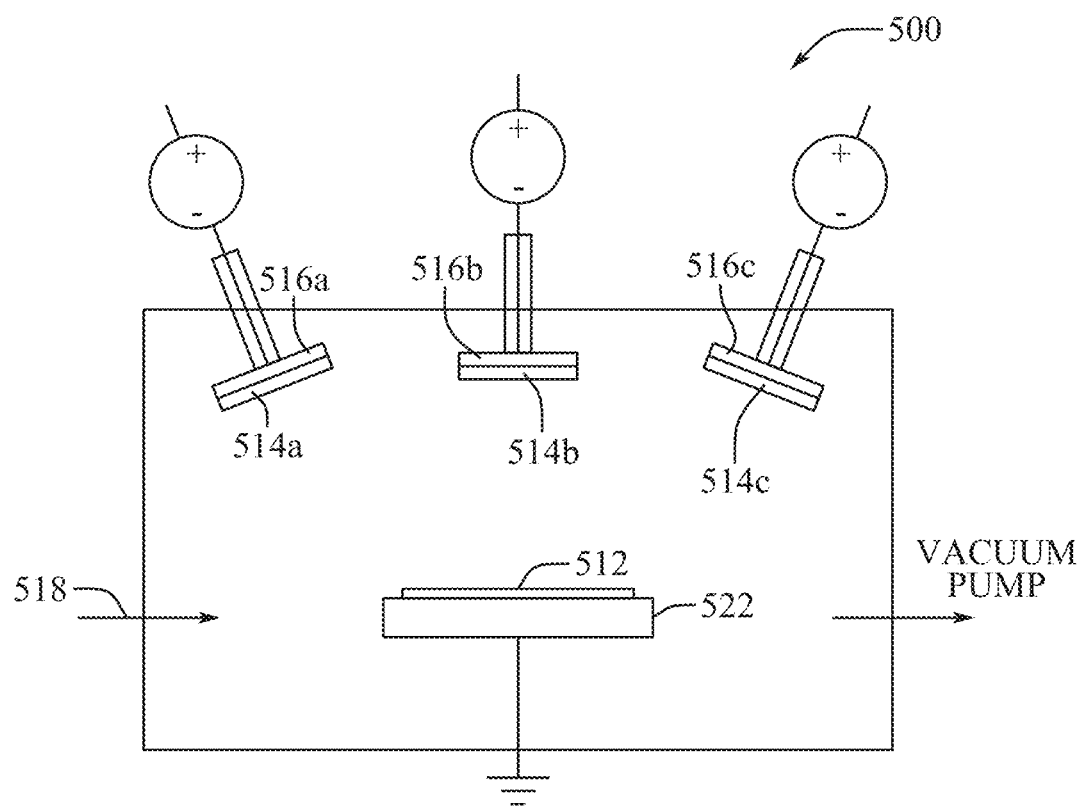
FIG. 5A shows a co-sputtering PVD system for forming a nanotwinned metallic alloy material.
Figure 5B:
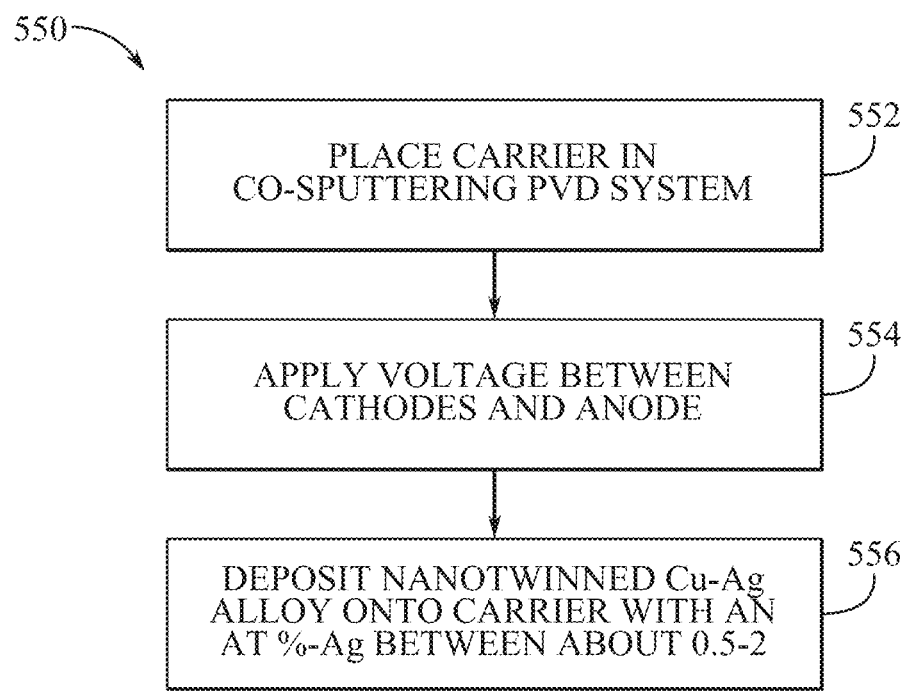
FIG. 5B shows a process flow diagram for a process of forming a nanotwinned metallic alloy material.

Along these lines, as shown in FIG. 5B, at least one example of a method 550 of forming a nanotwinned Cu—Ag alloy material, such as those materials described herein, includes placing a carrier within a co-sputtering PVD system at block 552. Such a system can be substantially the same or similar to the system 500 illustrated in FIG. 5A. In at least one example, the method 550 can include applying a voltage between the cathodes and anode of the PVD system at block 554. In at least one example the method 550 can include depositing a nanotwinned Cu—Ag alloy film onto the carrier with an at %-Ag of between about 0.5-2 at block 556.

Figure 6A:
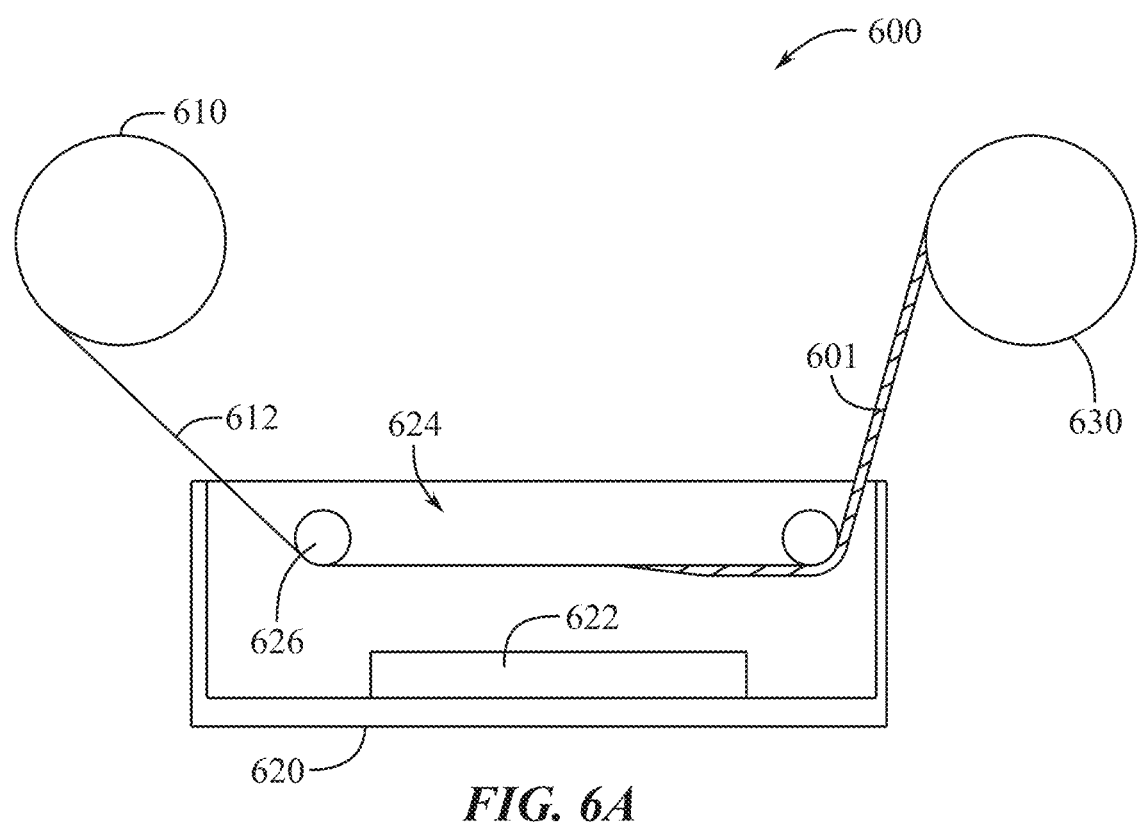
FIG. 6A shows a schematic diagram of a system for forming a nanotwinned metallic alloy material.

FIG. 6A illustrates a schematic diagram of a system 600 for forming a nanotwinned metallic alloy material 601, such as the nanotwinned Cu—Ag alloys described herein, using an electroplating process. In some examples, the system 600 can include a carrier or substrate 612 that can be fed through, and pass between, any number of rollers, wheels, spools, or other apparatuses or mechanisms for moving and/or supporting the carrier 612. In some examples, the carrier 612 can be a sheet or film of material. For example, the carrier 612 can include a polymeric material, a metallic material, and/or combinations thereof. In some examples, the carrier 612 can be flexible and can be rolled up or stored in an otherwise compact manner, and then unwound and fed through the system 600. In some examples, the carrier 612 can be electrically conductive or can include electrically conductive materials. In the present example, the carrier 612 can be wound around a first spool 610, whereupon it can pass under or otherwise interact with rollers or support components, such as roller 626, before being wrapped around a second spool 660 once a nanotwinned Cu—Ag alloy material has been formed thereon. Accordingly, in use, the carrier 612 can be fed from the first spool 610 onto the second spool 660 during the deposition of the nanotwinned Cu—Ag alloy material 601. The presently illustrated system 600 is just one example of a system for forming a nanotwinned metallic alloy material 601, and such a system can have any geometry or configuration, as desired.

In some examples, the carrier 612 can be fed from the first spool 610 into a deposition tank, bath, or chamber 620. In some examples, the deposition bath 620 can be an electrodeposition or electroplating bath 620. Thus, in some examples, the deposition bath 620 can contain an electrolyte solution 624 and can include one or more anodes 622 at least partially immersed in the electrolyte solution 624. During a nanotwinned metallic alloy material 601 deposition process, an electrical current can be provided to the anode 622 immersed in the electrolyte solution 624, with the carrier 612 acting as the cathode in the deposition cell. In some examples, the electrolyte solution 624 contains dissolved cations of the metal or metals that are to be deposited onto the carrier 612. For example, where a nanotwinned Cu—Ag alloy is being deposited, the electrolyte solution 624 can include copper cations and silver cations.

In at least one example, the electrolyte solution 624 can include Cu ion sources such as $CuSO_4$ and/or $Cu(NO_3)_2$ and Ag ion sources can include compositions such as $AgNO_3$. In at least one example, additional chemical additives can be added to the electrolyte solution 624 having functions such as accelerators (to improve grain structure), suppressors (to improve plating uniformity and selecting specific grain orientation), and wetting agents (removing H2 bubbles from the surface).

In some examples, the electrolyte solution 624 can contain other constituent materials, such as associated anions, a suppressor agent or agents, and/or constituents to adjust the properties of the solution, such as the viscosity or pH. In some examples, a suppressor agent can be any constituent that can prevent or inhibit the formation of deposition hotspots on the carrier surface. That is, locations where material can be deposited preferentially as compared to other surface locations. Thus, in some examples, a suppressor agent can allow for relatively uniform deposition across the entire immersed surface of a carrier 612. In some examples, a suppressor agent can include water-soluble mono- or co-polymers. In some examples, a suppressor agent can include one or more polymeric compounds such as polyethylene glycol (PEG) or bis(3-sulfopropyl) disulfide (SPS). In some examples, other compounds or elements can serve as suppressor agents, such as chloride ions (Cl—).

In some examples, the electrolyte solution can include Cu ions as the cation, for example $Cu^{2+}$ ions. In some examples, the corresponding anion can include $SO_4^{2-}$ ions or any other ions. In some examples, the electrolyte solution can include compounds such as $H_2SO_4$ or other components to adjust the pH of the solution or contribute anions. In some examples, the electrolyte solution can include constituents such as one or more deposition accelerators and wetting agents.

In some examples, the electric current drives a reduction reaction which deposits or plates the metal cations onto the carrier 612 in the form of a nanotwinned metallic alloy material 601. Further, as the carrier 612 is fed from the first spool 610 to the second spool 630 through the electroplating bath 620, the nanotwinned metallic alloy material 601 is progressively deposited over the length of the carrier 612 to a desired thickness. Accordingly, the system 600 can be used to form a foil, sheet, or film of nanotwinned metallic alloy material 601 onto the carrier 612. In some examples, the deposited nanotwinned metallic alloy material 601 can have a thickness from about 4 microns up to several millimeters, for example, less than about 10 microns, at least about 50 microns, or even up to about 10 mm. In some examples, the thickness of the nanotwinned metallic alloy material 601 can be substantially uniform across the entire carrier 612. In some examples, however, the thickness of the deposited nanotwinned metallic alloy material 601 can vary across the length and width of the carrier 612, as desired.

Figure 6B:
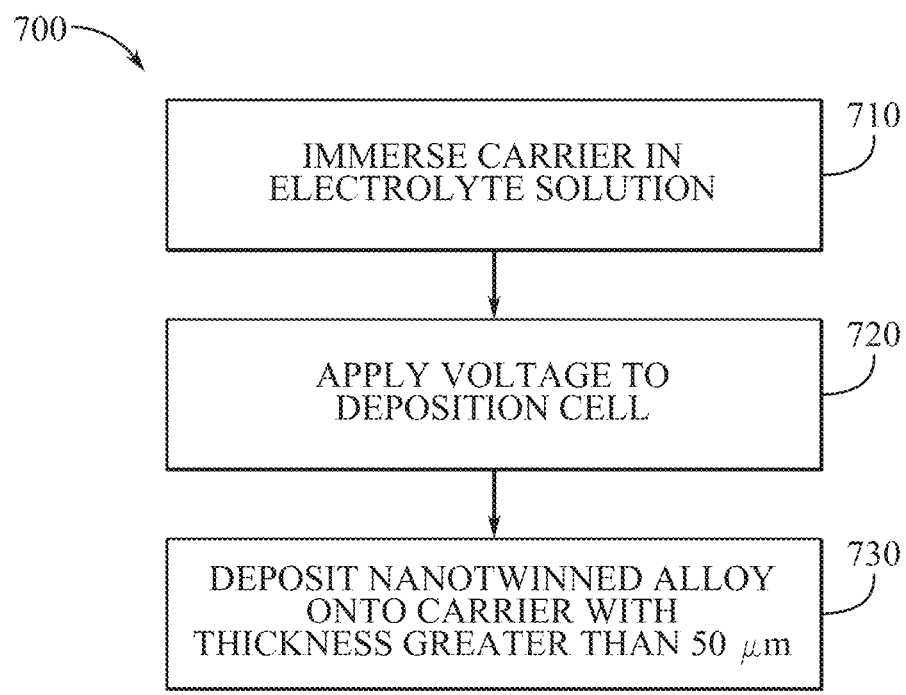
FIG. 6B shows a process flow diagram for a process of forming a nanotwinned metallic alloy material.

FIG. 6B illustrates a process flow diagram of an exemplary process 700 for depositing or forming a nanotwinned metallic material, as described herein, such as nanotwinned metallic material 601 deposited onto the carrier 612 by the system 600. The process 700 for depositing the nanotwinned metallic material can be an electrodeposition or electroplating process, and can include immersing a carrier in an electrolyte solution at block 710, applying a voltage to a deposition cell including the carrier and the electrolyte solution at block 720, and depositing the nanotwinned metallic alloy material, such as nanotwinned Cu—Ag alloy material, onto the carrier to a desired thickness, for example, 1-5 microns, 5-10 microns, 10-20 microns, 20-50 microns, or greater than about 50 microns, at block 730.

At block 710, a carrier is at least partially immersed in an electrolyte solution. In some examples, this can include at least partially immersing a carrier, such as carrier 612 illustrated with respect to FIG. 6A, in an electrolyte solution including cations of the metal that is to be deposited or formed. In some examples, the carrier can be at least partially immersed in an electroplating bath, for example, as shown in FIG. 6A, although any suitable immersion technique and electrolyte solution container can be used.

At block 720, a voltage is applied to a deposition cell including the carrier and the electrolyte solution. In some examples, the deposition cell can include a cathode, such as the carrier, onto which the nanotwinned metallic alloy material is to be deposited, an electrolyte solution, and an anode. For example, as shown in FIG. 6A, the deposition cell can include the carrier 612, the deposition bath 620 including the electrolyte solution 624, and the anode, 622. The voltage can drive an alternating current or a direct current, and can be applied so as to achieve a desired current density or range of current densities at the carrier. In some examples, such as when direct current is applied or driven to the deposition cell, the current density at the location or locations on the carrier where nanotwinned metallic alloy material is deposited can be from about 1 amperes per square decimeter (ASD) to about 500 ASD. In some examples, the current density at the location on the carrier where nanotwinned metallic material is deposited can be greater than or equal to about 10 ASD, greater than or equal to about 50 ASD, greater than or equal to about 100 ASD, greater than or equal to about 250 ASD or greater than or equal to about 500 ASD or more. In some examples, the current density can be about 12 ASD.

In some examples, alternating current, or pulsed direct current, can be applied to the deposition cell. In some examples where pulsed current is applied to the deposition cell, the current density at locations on the carrier where nanotwinned metallic material is deposited can be between about 1 ASD and about 500 ASD during the pulse. For example, the current density at the location on the carrier where nanotwinned metallic material is deposited can be greater than or equal to about 1 ASD, greater than or equal to about 10 ASD, greater than or equal to about 50 ASD, greater than or equal to about 100 ASD, greater than or equal to about 250 ASD, or greater than or equal to about 500 ASD or more. In some examples, the current density can be about 80 ASD during the pulses.

In some examples, a pulse or pulses of the pulsed current can have a duration between 2 and about 500 milliseconds (ms). For example, one or more pulses of the pulsed current can have a duration greater than or equal to about 2 ms, greater than or equal to about 50 ms, greater than or equal to about 100 ms, greater than or equal to about 250 ms, or greater than or equal to about 500 ms or more. In some examples, a pulse or pulses can have a duration of about 3 ms. In some examples, the duration or durations between pulses can remain the same between each pulse or can vary as the deposition process is carried out. For example, the duration between each pulse can be from 10 to about 3000 ms. In some examples, the duration between pulses can be greater than or equal to 10 ms, greater than or equal to 100 ms, greater than or equal to 500 ms, greater than or equal to 1000 ms, greater than or equal to 2000 ms, or greater than or equal to 3000 ms or more. In some examples, the duration between pulses can be about 25 ms. Similarly, the pulse times themselves can be varied through the deposition process 700.

At block 730, a nanotwinned metallic alloy material is deposited onto at least a portion of the carrier, for example, a portion of the carrier immersed in the electrolyte solution, to a thickness. In some examples, the nanotwinned alloy metallic material can include Cu—Ag alloys described herein. In some examples, the nanotwinned metallic alloy material can be deposited to a thickness greater than or equal to about 30 microns, greater than or equal to about 40 microns, greater than or equal to about 50 microns, or greater than or equal to about 100 microns. In some examples, the nanotwinned metallic alloy material can be deposited to any desired thickness described herein.

Although illustrated as a separate block, the deposition of the nanotwinned metallic alloy material at block 730 can occur because of the voltage applied at block 720, and thus may not be a separate process step. Further details of systems and processes for forming nanotwinned metallic materials are described with respect to FIGS. 7A-7B.

Figure 7A:
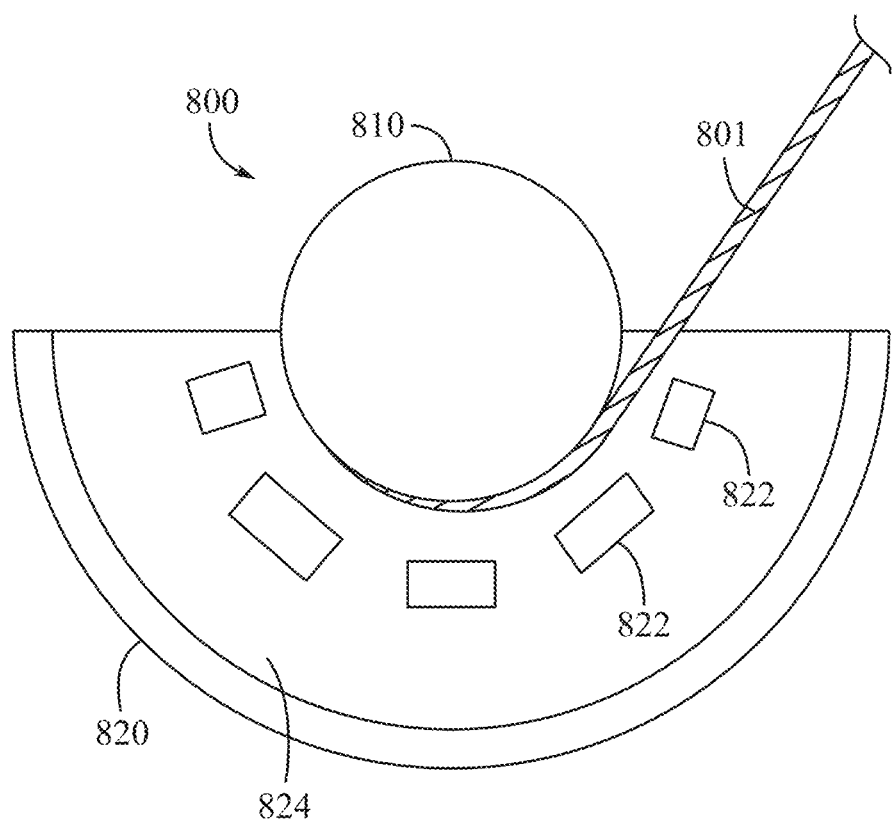
FIG. 7A shows a schematic diagram of a system for forming a nanotwinned metallic alloy material.

FIG. 7A illustrates a schematic diagram of a system 800 for forming a nanotwinned metallic material 801. In some examples, the system 800 can include a carrier or substrate 810 that can be at least partially immersed in an electrolyte solution 824 that is contained or otherwise held in a deposition tank 820. In some examples, the carrier 810 can include a conductive material, such as a metallic material. In some examples, the carrier 810 can include titanium. In some examples, the carrier 810 can have a substantially cylindrical shape and can take the form of a drum. In some examples, however, the carrier 810 can have substantially any desired shape. In the present example, the carrier 810 is partially immersed in the electrolyte solution 824, and can rotate so that the portion immersed in the electrolyte solution 824 can be moved out of the solution and any nanotwinned metallic alloy material 801 deposited thereon can be removed, for example, in a continuous manner. The presently illustrated system 800 is just one example of a system for forming a nanotwinned metallic alloy material 801, and such a system can have any geometry or configuration desired.

In some examples, the electrolyte solution 824 can be substantially similar to, and can include some or all of the features of the electrolyte solution 624 described herein. The deposition bath can further include one or more anodes 822 that can be positioned proximate to the carrier 810, which can act as a cathode during a deposition process, such as an electrodeposition or electroplating process. In some examples, a voltage or electric current can be driven through a deposition cell including the anodes 822, electrolyte solution 824, and carrier 810.

In some examples, the electric current drives a reduction reaction which deposits or plates the metal cations onto the carrier 810 in the form of a nanotwinned metallic alloy material 801. Further, as the carrier 810 is rotated about an axis, the nanotwinned metallic alloy material 801 is progressively deposited over the immersed portions of the carrier 810 to a desired thickness. The deposited material 801 can then be removed from the carrier 810, for example, as a free-standing film, foil, or sheet. Accordingly, the system 800 can be used to form a foil, sheet, or film of nanotwinned metallic alloy material 801. In some examples, the deposited nanotwinned metallic alloy material 801 can have a thickness from about 4 microns up to several millimeters, for example, up to about 10 mm. In some examples, the thickness of the nanotwinned metallic alloy material 801 can be substantially uniform as it is formed. In some examples, however, the thickness of the deposited nanotwinned metallic alloy material 801 can vary across its length and width, as desired.

Figure 7B:
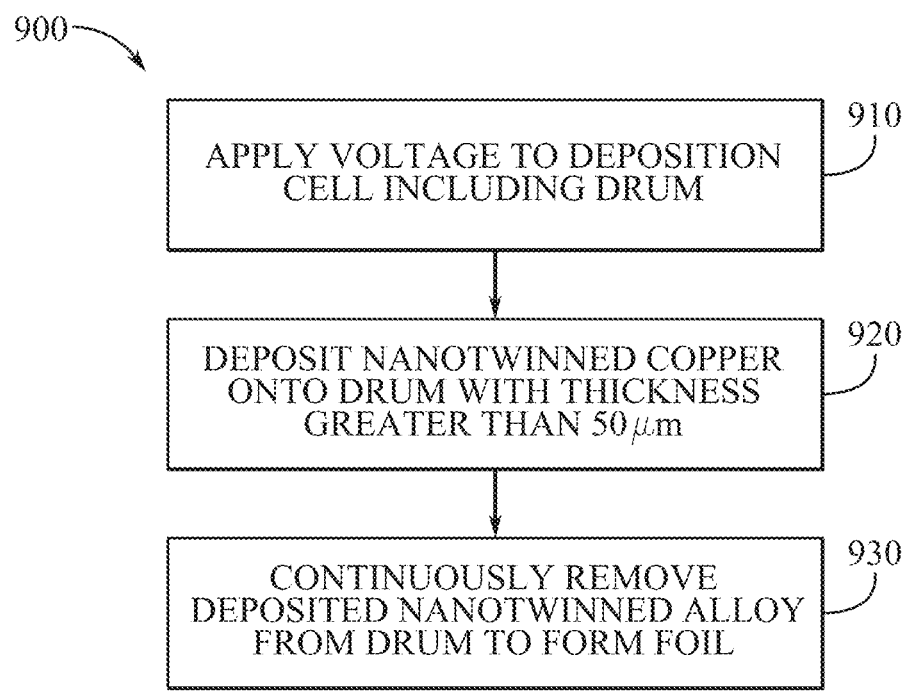
FIG. 7B shows a process flow diagram for a process of forming a nanotwinned metallic alloy material.

FIG. 7B illustrates a process flow diagram of an exemplary process 900 for depositing or forming a nanotwinned metallic alloy material, as described herein, such as alloy material 801 deposited onto the carrier 810 by the system 800. The process 900 for depositing the nanotwinned metallic alloy material can be an electrodeposition or electroplating process, and can include applying a voltage to a deposition cell including an at least partially immersed drum at block 910, depositing the nanotwinned metallic alloy material, such as nanotwinned Cu—Ag alloy materials described herein, onto the drum to a desired thickness, for example, greater than about 50 microns, at block 920, and continuously removing the deposited nanotwinned metallic alloy material from the drum, at block 930, to form a foil.

At block 910, a voltage is applied to a deposition cell including a carrier, such as a metallic drum, that is at least partially immersed in an electrolyte solution. In some examples, the deposition cell can include a drum or other carrier acting as a cathode onto which the nanotwinned metallic alloy material is to be deposited, an electrolyte solution, and one or more anodes. For example, as shown in FIG. 7A, the deposition cell can include the drum 810, the deposition bath 820 including the electrolyte solution 824, and the anodes 822. The voltage can be applied by driving an alternating current or a direct current, and can be applied so as to achieve a desired current density or range of current densities at the carrier.

In some examples, such as when direct current is applied or driven to the deposition cell, the current density at the location or locations on the drum where nanotwinned metallic alloy material is deposited can be from about 1 ASD to about 20 ASD. In some examples, the current density at the location on the drum where nanotwinned metallic alloy material is deposited can be greater than or equal to about 2 ASD, greater than or equal to about 5 ASD, greater than or equal to about 10 ASD, or greater than or equal to about 15 ASD or more. In some examples, the current density can be about 12 ASD. In some examples, alternating current, or pulsed direct current can be applied to the deposition cell. In some examples where pulsed current is applied to the deposition cell, the current density at locations on the drum where nanotwinned metallic material is deposited, such as those locations immersed in the electrolyte solution, can be between about 1 ASD and about 500 ASD during the pulse. For example, the current density at the location on the carrier where nanotwinned metallic material is deposited can be greater than or equal to about 1 ASD, greater than or equal to about 10 ASD, greater than or equal to about 50 ASD, greater than or equal to about 100 ASD, greater than or equal to about 250 ASD, or greater than or equal to about 500 ASD or more. In some examples, the current density can be about 80 ASD during the pulses.

In some examples, a pulse or pulses of the pulsed current can have a duration between 2 and about 500 ms. For example, one or more pulses of the pulsed current can have a duration greater than or equal to about 2 ms, greater than or equal to about 50 ms, greater than or equal to about 100 ms, greater than or equal to about 250 ms, or greater than or equal to about 500 ms or more. In some examples, a pulse or pulses can have a duration of about 3 ms. In some examples, the duration or durations between pulses can remain the same between each pulse or can vary as the deposition process 900 is carried out. For example, the duration between each pulse can be from 10 to about 3000 ms. In some examples, the duration between pulses can be greater than or equal to 10 ms, greater than or equal to 100 ms, greater than or equal to 500 ms, greater than or equal to 1000 ms, greater than or equal to 2000 ms, or greater than or equal to 3000 ms or more. In some examples, the duration between pulses can be about 25 ms. Similarly, the pulse times themselves can be varied through the deposition process 900.

At block 920, a nanotwinned metallic alloy material is deposited onto at least a portion of the drum, for example, a portion of the drum immersed in the electrolyte solution, to a desired thickness. In some examples, the nanotwinned metallic alloy material can include copper. In some examples, the nanotwinned metallic alloy material can include copper, silver, and/or an alloy thereof. In some examples, the nanotwinned metallic alloy material can be deposited to a thickness greater than or equal to about 30 microns, greater than or equal to about 40 microns, greater than or equal to about 50 microns, or greater than or equal to about 100 microns. In some examples, the nanotwinned metallic alloy material can be deposited to any desired thickness described herein.

At block 930, any nanotwinned metallic alloy material that has been deposited on the drum can be continuously removed from the drum to form a foil or sheet of nanotwinned metallic alloy material having a desired thickness. In some examples, the foil or sheet can be self-supporting. That is, the foil of nanotwinned metallic alloy material, as it is continuously removed from the drum, may not require a further carrier or support material to remain a single continuous foil. Further details of systems and processes for forming nanotwinned metallic alloy materials are described with respect to FIGS. 8A-10.

Figure 8A:
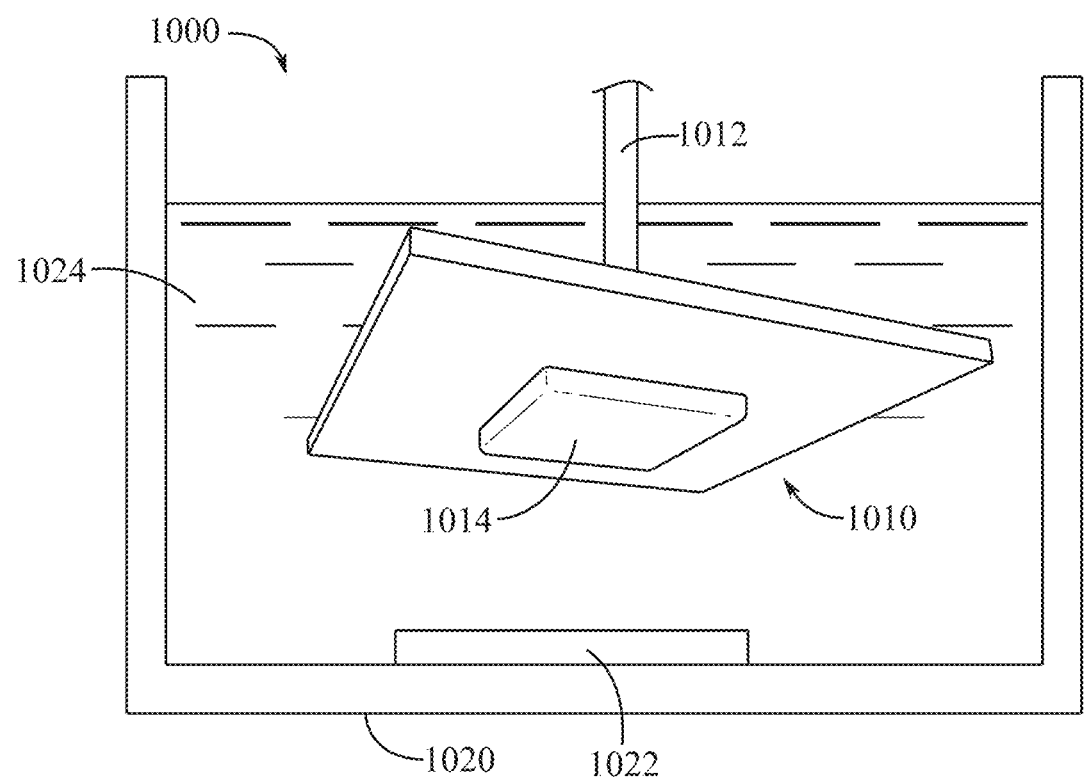
FIG. 8A shows a schematic diagram of a system for forming a component including a nanotwinned metallic alloy material.

FIG. 8A illustrates a schematic diagram of a system 1000 for forming a nanotwinned metallic alloy material, for example, in a desired shape for use as, or inclusion in, a component of an electronic device. In some examples, the system 1000 can include a carrier or substrate 1010 that can include a mandrel 1014 having a shape corresponding to the shape of a component including the nanotwinned metallic alloy material. In some examples, the mandrel 1014 can be immersed in an electrolyte solution 1024 and can be supported by a shaft 1012 or other support structure. In some examples, the shaft 1012 can raise or lower the mandrel 1014 out of the electrolyte solution 1024. The electrolyte solution 1024 can be substantially similar to and can include some or all of the features of the electrolyte solutions described herein, such as the solution 624. As with the systems 600, 800 described herein, the electrolyte solution 1024 can be contained in a deposition bath 1020 that can also include one or more anodes 1022 to form a deposition cell. Accordingly, in some examples, the system 1000 can be an electroforming system 1000. The mandrel 1014 can include a conductive material, such as a conductive polymeric and/or metallic material. The presently illustrated system 1000 and mandrel 1014 are just one example of a system for forming a nanotwinned metallic alloy component, and such a system can have any geometry or configuration, as desired.

Figure 8B:
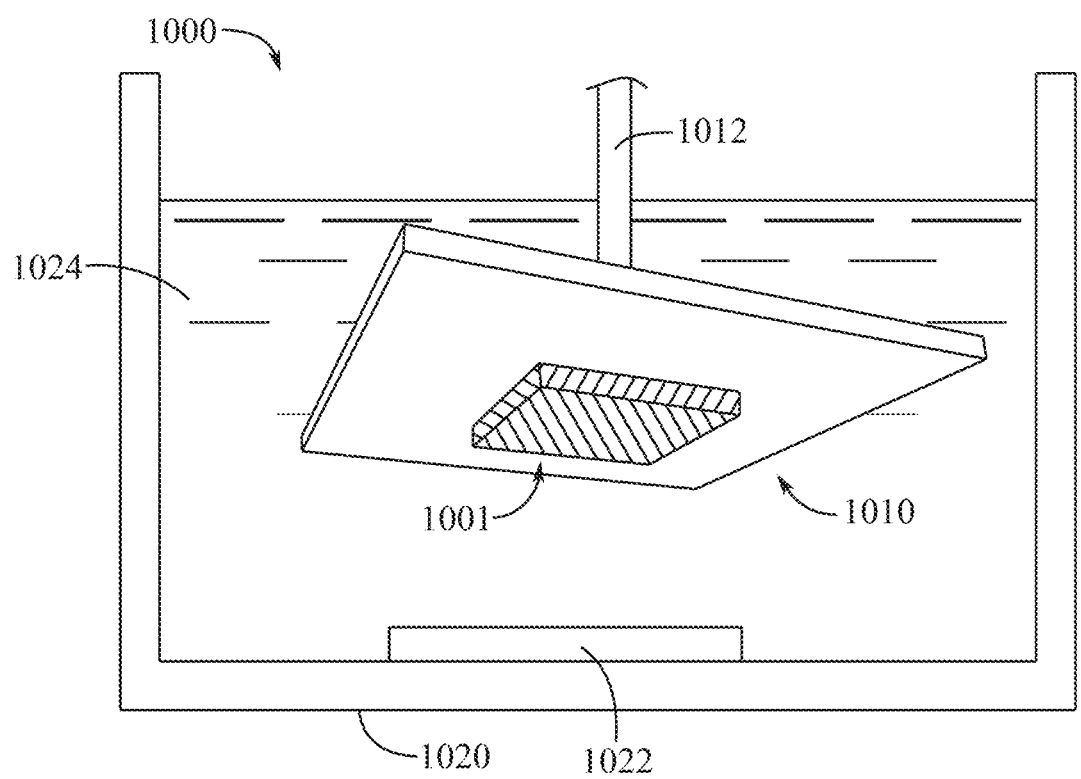
FIG. 8B shows a stage in a process of forming a component including a nanotwinned metallic alloy material using the system of FIG. 8A.

As shown in FIG. 8B, during a nanotwinned metallic alloy material 1001 deposition process, an electrical current can be provided to the anode 1022 immersed in the electrolyte solution 1024 with the mandrel 1014 acting as the cathode. In some examples, the electric current drives a reduction reaction which deposits or plates the metal cations onto the mandrel 1014 in the form of a nanotwinned metallic alloy material 1001 having a shape corresponding to the shape of the mandrel 1014. In some examples, the mandrel can have an inverse shape of the desired shape of the deposited nanotwinned metallic alloy component 1001. In some examples, the nanotwinned metallic alloy material 1001 can be deposited onto the mandrel 1014 to a desired thickness. Accordingly, the system 1000 can be used to form a component including a nanotwinned metallic alloy material 1001 having a thickness from about 1 micron or less up to several millimeters, for example, up to about 10 mm. In some examples, the thickness of the nanotwinned metallic alloy material 1001 can be substantially uniform across the entire mandrel 1014. In some examples, however, the thickness of the deposited nanotwinned metallic alloy material 1001 can vary across various locations on the mandrel 1014.

Figure 8C:
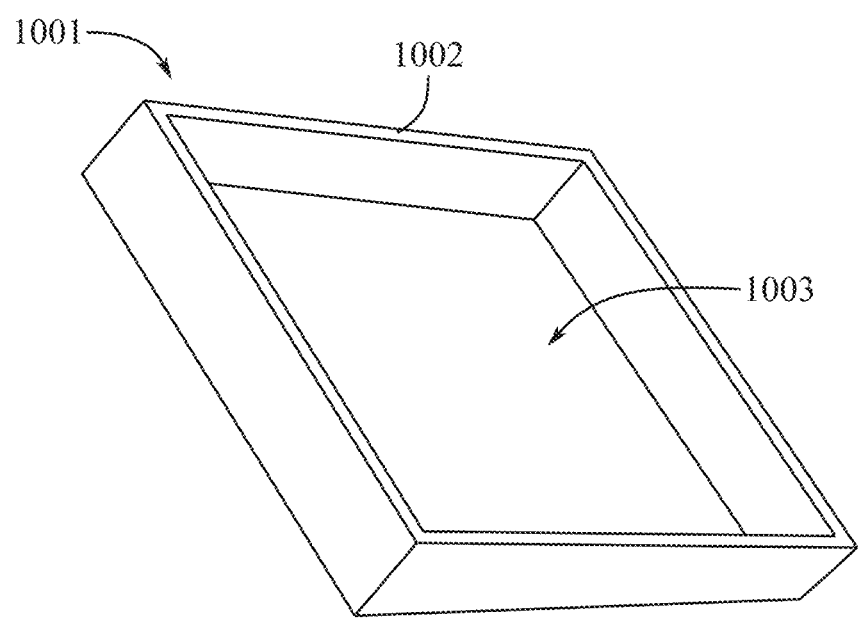
FIG. 8C shows a component including a nanotwinned metallic alloy material.

FIG. 8C illustrates the component 1001 formed from the deposited nanotwinned metallic alloy material having a shape corresponding to the shape of the mandrel 1014. As can be seen, the component 1001 can include three-dimensional features. For example, the component 1001 can include a base 1003 that has one or more features 1002 extending therefrom. The component 1001 illustrated in FIG. 8C is just one example of a component that can be formed with the system 1000. Accordingly, the system 1000 can be used to form components from deposited nanotwinned metallic alloy materials having any desired shape or configuration, including complicated three-dimensional shapes that may not be able to be formed as a single continuous body by other deposition processes or manufacturing techniques.

Figure 9A:
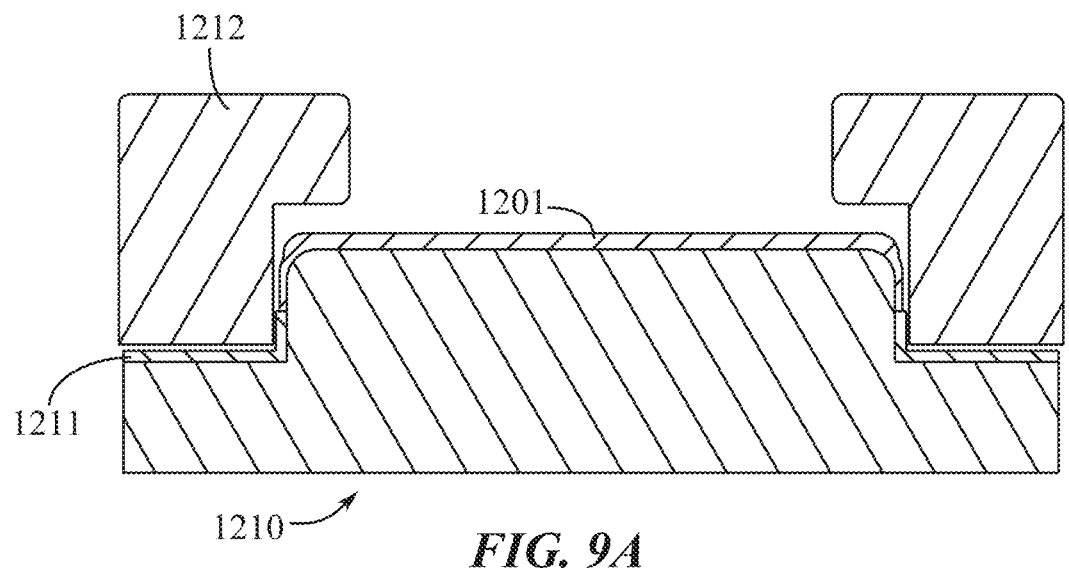
FIG. 9A shows a stage of a process for forming a component including a nanotwinned metallic alloy material.

FIG. 9A shows a cross-sectional view of a portion of a system for forming a nanotwinned metallic alloy material. The system can be substantially similar to the system 1000 described with respect to FIGS. 8A-8C or substantially similar to the co-sputtering PVD system 500 shown in FIG. 5A. In this example, the system can include a carrier or a substrate 1210 that can have a shape corresponding to the shape of a component including the nanotwinned metallic alloy material. In some examples, the system can also include one or more masking components, such as components 1211 and 1212. In some examples, the component 1211 can include a physical mask that can block or protect one or more portions of the substrate 1210 from exposure to an electrolyte solution. In some examples, the mask 1211 can include a nonconductive material, such as a polymer. In some examples, the mask 1211 can include a nonconductive, or insulating paint. The system can also include a component 1212 that can physically mask desired areas of the substrate 1210 and can also control the flow of the electrolyte solution around the substrate 1210.

Accordingly, in some examples, a component 1201 including a nanotwinned Cu—Ag alloy can be deposited on the substrate 1201 such that one or more portions of the component 1201 can be thicker than one or more other portions. For example, as shown, a top portion of the component 1201 can have a thickness of about 140 microns, while side portions of the component 1201 can have thicknesses of about 85 microns. In some examples, one or more surfaces of the component 1201 can have any amount of increased thickness, as desired. For example, one or more surfaces of the component 1201 can be 50 microns, 100 microns, 150 microns, or 200 microns, or more, thicker than one or more other portions of the component 1201.

Figure 9B:
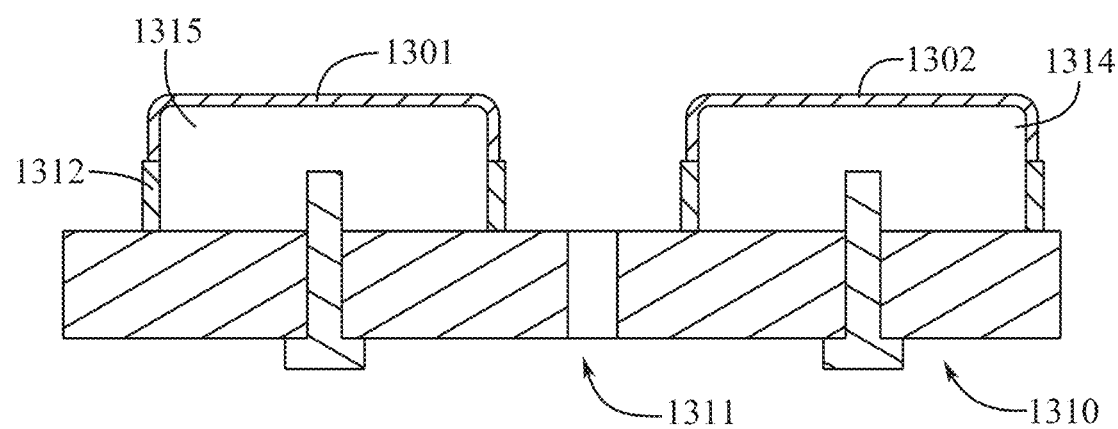
FIG. 9B shows a schematic diagram of a system for forming a component including a nanotwinned metallic alloy material.

FIG. 9B shows a schematic diagram of a system for forming multiple components including a nanotwinned metallic alloy material. The system illustrated in FIG. 9B can be substantially similar to, and can include some or all of the features of the system 1000 described with respect to FIGS. 8A-8C. In some examples, however, the system can include a substrate 1310 that includes at least a first mandrel 1314 and a second mandrel 1315, onto which at least a first component 1302 including nanotwinned metallic alloy material and a second component 1301 including nanotwinned metallic alloy material can be formed. As shown, some or all of the mandrels 1314, 1315 can be masked with a component 1312 that can be substantially similar to the masking component 1211 described with respect to FIG. 9A. Further, in order to facilitate the flow of electrolyte solution in the deposition cell and to ensure even deposition on the mandrels 1314, 1315, the substrate 1310 can define one or more apertures 1311 that can allow electrolyte solution to flow therethrough.

Figure 9C:
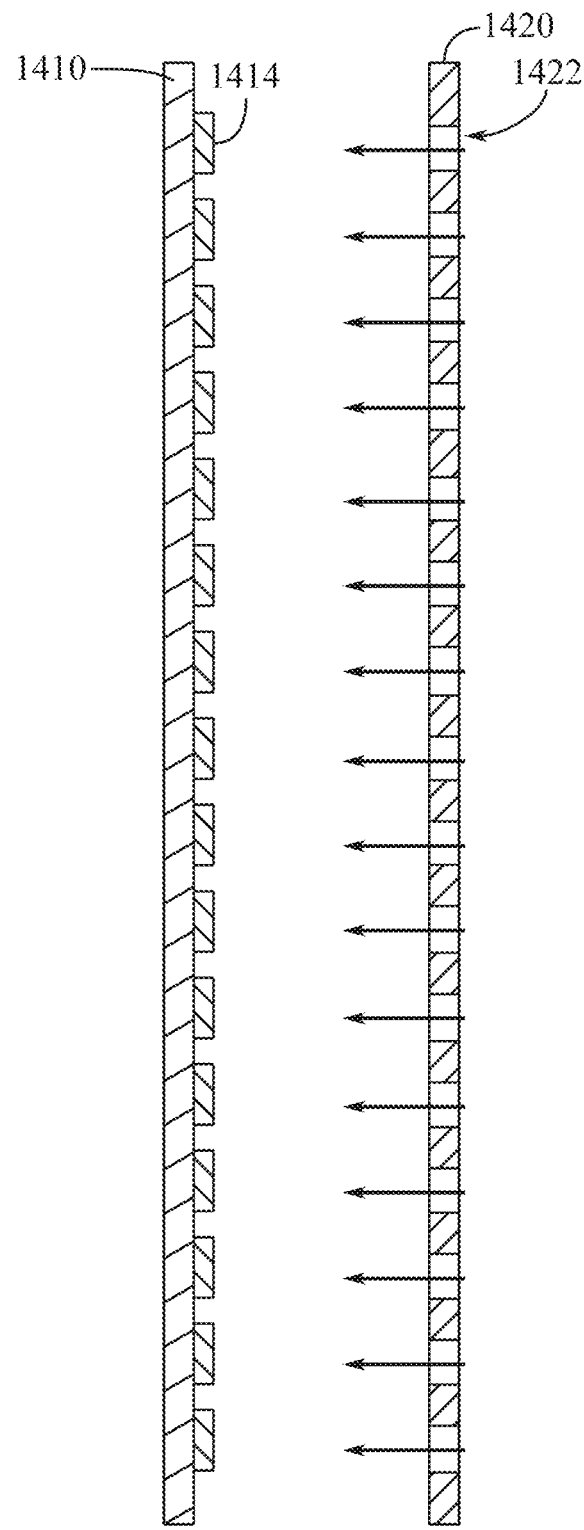
FIG. 9C shows a schematic diagram of a system for forming a component including a nanotwinned metallic alloy material.

FIG. 9C shows a schematic diagram of a system for forming multiple components including a nanotwinned metallic material that can be substantially similar to, and can include some or all of the features of the system described with respect to FIG. 9B. In this example, the system can include a substrate 1410 that can include any number of mandrels 1414 disposed thereon as desired. Separate components including nanotwinned metallic alloy material can be formed or deposited onto each mandrel 1414. In some examples, an anode 1420 of the system can be disposed near or opposite the mandrels 1414. In some examples, the anode 1420 can define one or more apertures 1422 through which electrolyte solution can flow or be moved, as indicated here with arrows.

Figure 10:
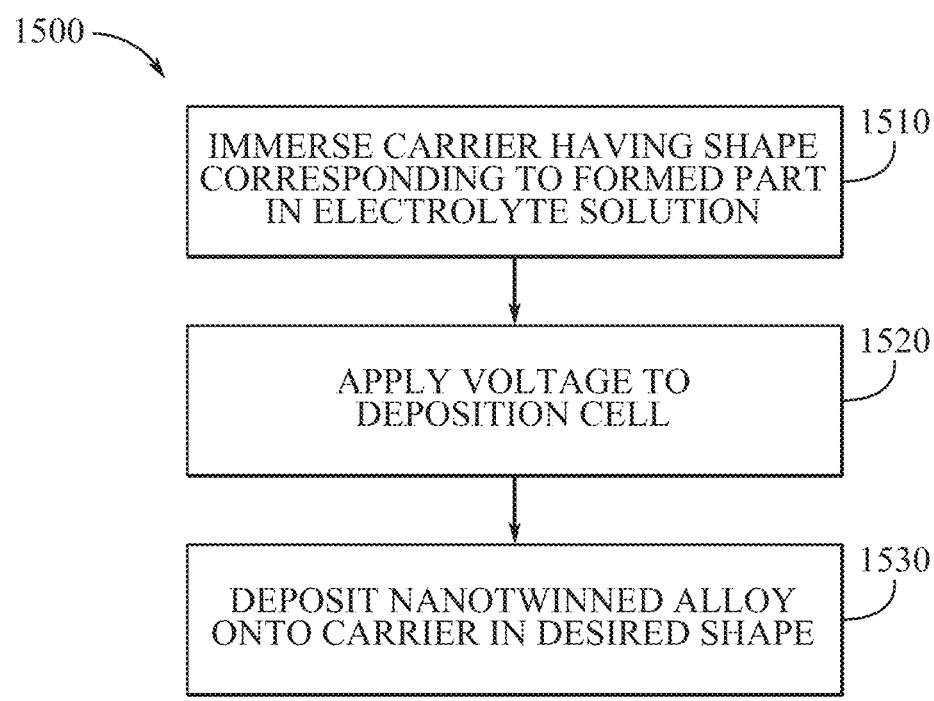
FIG. 10 shows a process flow diagram for a process of forming a component including a nanotwinned metallic alloy material.

FIG. 10 illustrates a process flow diagram of an exemplary process 1500 for depositing or electroforming a nanotwinned metallic alloy material in a desired shape, as described herein, such as nanotwinned metallic alloy component 1001 deposited onto the mandrel 1014 by the system 1000. The process 1500 for depositing the nanotwinned metallic alloy component can be an electroforming process and can include immersing a carrier or mandrel having a shape corresponding to the shape of the formed component in an electrolyte solution at block 1510, applying a voltage to a deposition cell including the carrier and the electrolyte solution at block 1520, and depositing the nanotwinned metallic alloy material, such as nanotwinned Cu—Ag alloys described herein, onto the carrier in a desired shape and to a desired thickness, for example, greater than about 50 microns, at block 1530.

At block 1510, one or more carriers or mandrels is at least partially immersed in an electrolyte solution. In some examples, this can include at least partially immersing a carrier, such as mandrel 1014 illustrated with respect to FIG. 8A, in an electrolyte solution including cations of the metal that is to be deposited or formed. In some examples, the carrier can be at least partially immersed in an electroforming bath, for example, shown in FIG. 8A, although any suitable immersion technique and electrolyte solution container can be used.

At block 1520, a voltage is applied to a deposition cell including the carrier and the electrolyte solution. In some examples, the deposition cell can include a cathode onto which the nanotwinned metallic alloy material is to be deposited, such as the carrier, an electrolyte solution, and one or more anodes. For example, as shown in FIG. 8A, the deposition cell can include the mandrel 1014, the deposition bath 1020 including the electrolyte solution 1024, and the anode 1022. The voltage can be applied and can drive an alternating current or a direct current to achieve a desired current density or range of current densities at the carrier. In some examples, such as when direct current is applied or driven to the deposition cell, the current density at the location or locations on the carrier where nanotwinned metallic alloy material is deposited can be from about 1 ASD to about 500 ASD. In some examples, the current density at the location on the carrier where nanotwinned metallic material is deposited can be greater than or equal to about 10 ASD, greater than or equal to about 50 ASD, greater than or equal to about 100 ASD, greater than or equal to about 250 ASD or greater than or equal to about 500 ASD or more. In some examples, the current density can be about 12 ASD.

In some examples, alternating current, or pulsed direct current, can be applied to the deposition cell. In some examples where pulsed current is applied to the deposition cell, the current density at locations on the carrier where nanotwinned metallic material is deposited can be between about 1 ASD and about 500 ASD during the pulse. For example, the current density at the location on the carrier where nanotwinned metallic material is deposited can be greater than or equal to about 1 ASD, greater than or equal to about 10 ASD, greater than or equal to about 50 ASD, greater than or equal to about 100 ASD, greater than or equal to about 250 ASD, or greater than or equal to about 500 ASD or more. In some examples, the current density can be about 80 ASD during the pulses.

In some examples, a pulse or pulses of the pulsed current can have a duration between 2 and about 500 milliseconds (ms). For example, one or more pulses of the pulsed current can have a duration greater than or equal to about 2 ms, greater than or equal to about 50 ms, greater than or equal to about 100 ms, greater than or equal to about 250 ms, or greater than or equal to about 500 ms or more. In some examples, a pulse or pulses can have a duration of about 3 ms. In some examples, the duration or durations between pulses can remain the same between each pulse or can vary as the deposition process 1500 is carried out. For example, the duration between each pulse can be from 10 to about 3000 ms. In some examples, the duration between pulses can be greater than or equal to 10 ms, greater than or equal to 100 ms, greater than or equal to 500 ms, greater than or equal to 1000 ms, greater than or equal to 2000 ms, or greater than or equal to 3000 ms or more. In some examples, the duration between pulses can be about 25 ms. Similarly, the pulse times themselves can be varied through the deposition process 1500.

At block 1530, a nanotwinned metallic alloy material is deposited onto at least a portion of the carrier, for example, a portion of the carrier immersed in the electrolyte solution, to a desired thickness. In some examples, the nanotwinned metallic alloy material can include copper. In some examples, the nanotwinned metallic alloy material can include copper, silver, and/or an alloy thereof. In some examples, the nanotwinned metallic alloy material can be deposited to a thickness greater than or equal to about 30 microns, greater than or equal to about 40 microns, greater than or equal to about 50 microns, or greater than or equal to about 100 microns. In some examples, the nanotwinned metallic alloy material can be deposited to any desired thickness. In some examples, the nanotwinned metallic alloy material is formed onto the carrier such that the shape of the material corresponds to the shape of the mandrel. Accordingly, a component formed from the process 1500 can have any desired shape, given that a mandrel having a corresponding shape is used as the carrier. In some examples, the deposited or formed nanotwinned alloy metallic material can have the shape of all or a portion of any of the components including nanotwinned metallic alloy materials described herein.

Any number or variety of electronic device components can include a nanotwinned metallic alloy material, as described herein. The process for forming such a nanotwinned metallic alloy material, for example, forming nanotwinned metallic alloy material having a thickness greater than 50 microns, can include depositing the nanotwinned metallic alloy material onto a carrier to a desired thickness. The nanotwinned metallic alloy material can be formed into a desired shape during deposition and/or can be subjected to manufacturing processes or treatments to achieve a desired shape, for example, to form all or a portion of an electronic component. Various example components including nanotwinned metallic alloy materials are described below with reference to FIGS. 11A-14.

Figure 11A:
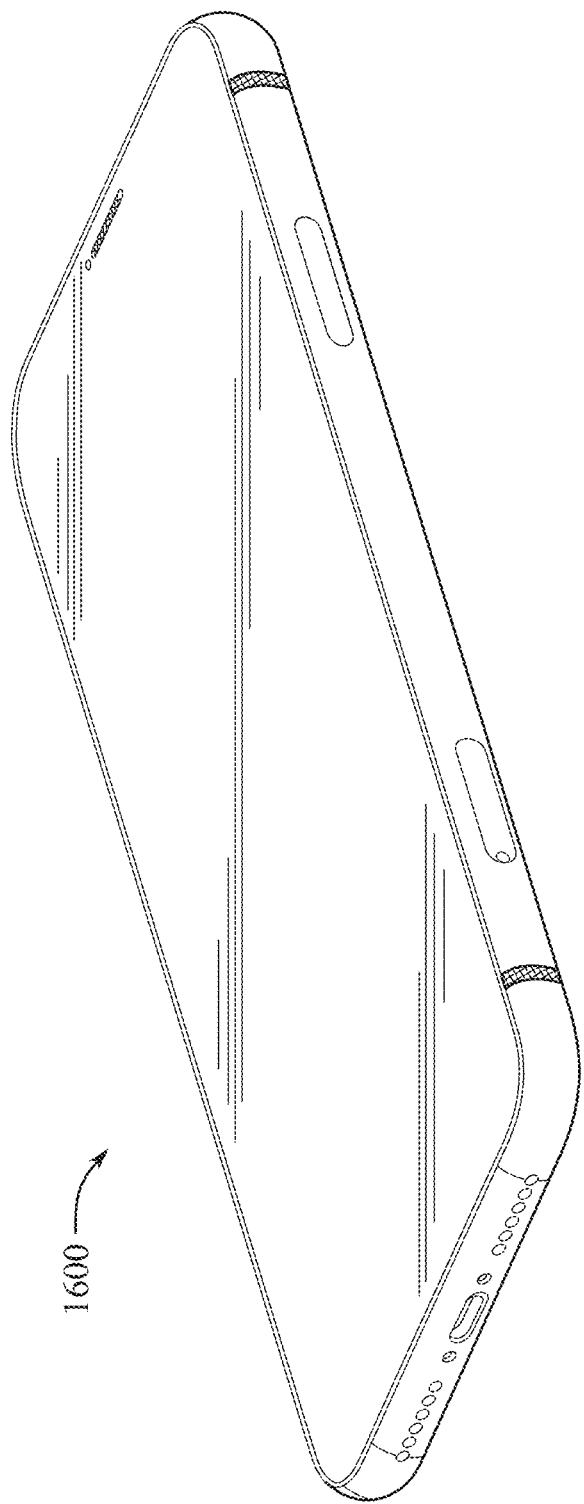
FIG. 11A shows a perspective view of an electronic device.

FIG. 11A illustrates a perspective view of an example of an electronic device 1600. The electronic device 1600 shown in FIG. 11A is a mobile wireless communication device, such as a smartphone. The smartphone of FIG. 11A is merely one representative example of a device that can be used in conjunction with the systems and methods described herein, and that can include one or more components and/or materials described herein. Electronic device 1600 can correspond to any form of a wearable electronic device, a portable media player, a media storage device, a portable digital assistant ("PDA"), a tablet computer, a computer, a mobile communication device, a GPS unit, a remote-control device, or any other electronic device. The electronic device 1600 can be referred to as an electronic device, or a consumer device.

Figure 11B:
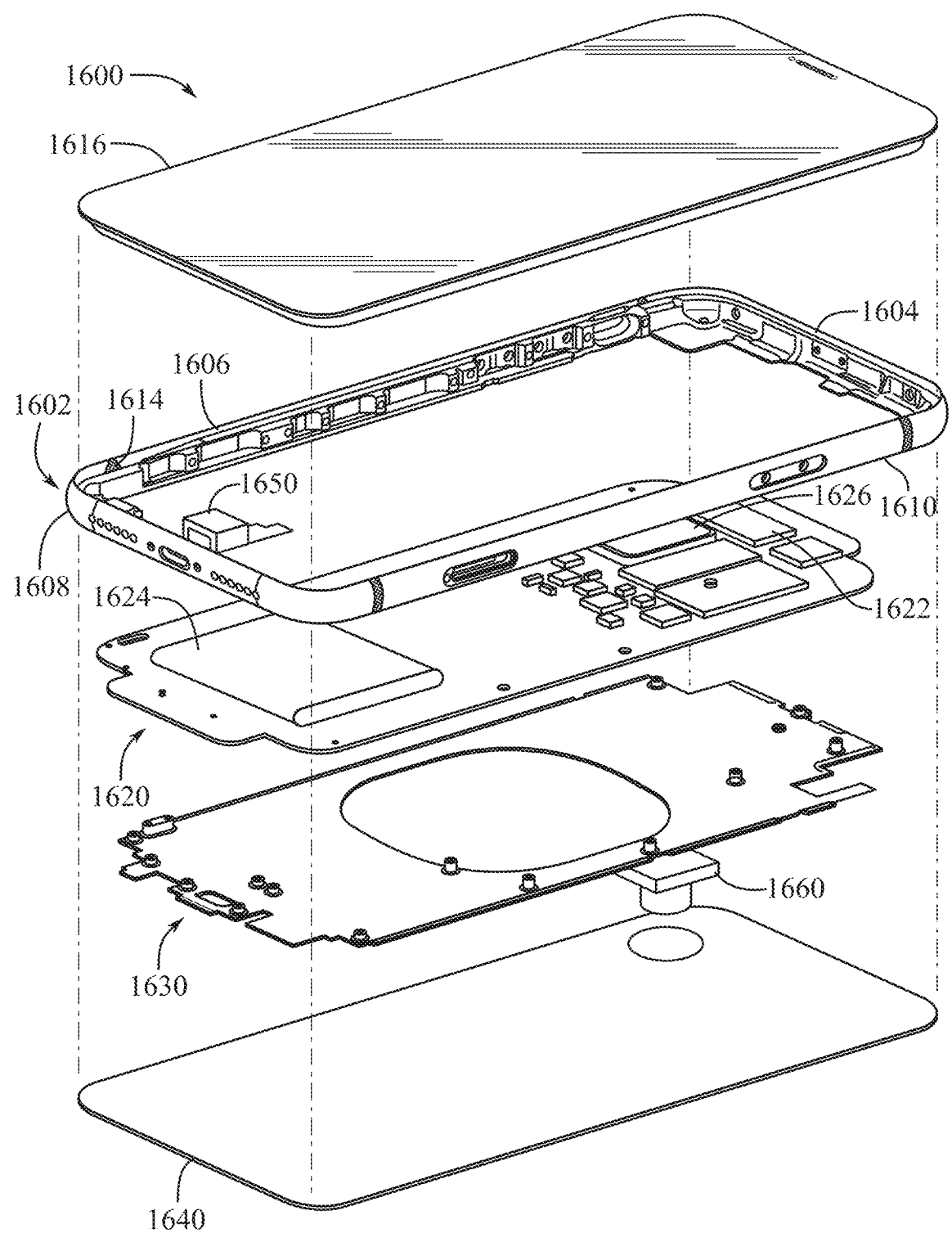
FIG. 11B shows an exploded view of the electronic device of FIG. 11A.

FIG. 11B illustrates an exploded view of the electronic device 1600. The electronic device 1600 can have a housing that includes a frame or a band 1602 that defines an outer perimeter and a portion of the exterior surface of the electronic device 1600. The band 1602, or portions thereof, can be joined to one or more other components of the device, as described herein. In some examples, the band 1602 can include several sidewall components, such as a first sidewall component 1604, a second sidewall component 1606, a third sidewall component 1608 (opposite the first sidewall component 1604), and a fourth sidewall component 1610. The sidewall components can be joined, for example, at multiple locations, to one or more other components of the device, as described herein. The housing of the device 1600, for example, the band 1602, can include one or more features to receive or couple to other components of the device 1600. In some examples, one or more of the sidewall components 1604, 1606, 1608, 1610 can include a metallic material, such as steel.

In some examples, one or more of the sidewall components 1604, 1606, 1608, 1610 can include a nanotwinned metallic material, such as a nanotwinned copper alloy material. In some examples, an interior portion of one or more of the sidewall components 1604, 1606, 1608, 1610, such as a portion that at least partially defines an internal volume of the device 1600, can include the nanotwinned metallic material. In some examples, while some portion of one or more of the sidewall components 1604, 1606, 1608, 1610 can include a nanotwinned metallic alloy material, a second portion of one or more of the sidewall components 1604, 1606, 1608, 1610 can include an additional material, such as steel. For example, the interior portion of one or more of the sidewall components 1604, 1606, 1608, 1610 can include the nanotwinned metallic alloy material and an exterior or outer portion, such as a portion at least partially defining an exterior surface of the device 1600 can include a second, different material, such as steel. In some examples, however, the entirety of one or more of the sidewall components 1604, 1606, 1608, 1610 can be formed from the nanotwinned metallic alloy materials described herein. In some examples, one or more of the sidewall components 1604, 1606, 1608, 1610 can allow for one or more of the sidewall components 1604, 1606, 1608, 1610 to provide high levels of thermal conductivity, for example, via the nanotwinned metallic alloy material, to provide thermal management to the device 1600, while maintaining a desired hardness, durability and exterior finish for the device 1600.

In some examples, some of the sidewall components 1604, 1606, 1608, 1610 can form part of an antenna assembly (not shown). As a result, a non-metal material or materials can separate the sidewall components 1604, 1606, 1608, 1610 of the band 1602 from each other, in order to electrically isolate the sidewall components 1604, 1606, 1608, 1610. For example, a separating material 1614 separates the second sidewall component 1606 from the third sidewall component 1608. The aforementioned materials can include an electrically inert or insulating material(s), such as plastics and/or resin, as non-limiting examples. Further, as described herein, one or more of the sidewall components 1604, 1606, 1608, 1610 can be electrically or physically connected to internal components of the electronic device 1600, such as a support component 1630, as described herein. In some examples, these electrical connections can be achieved by joining a sidewall component 1604, 1606, 1608, 1610 to an internal component, for example, as part of the antenna assembly.

The electronic device 1600 can further include a display assembly 1616 that can include an outer protective layer or cover. The display assembly 1616 can include multiple layers, with each layer providing a unique function. In some examples, the outer layer, cover, or portion of the display assembly 1616 defining an external surface of the device 1600, can be considered part of the housing of the device. Further, the protective cover of the display assembly 1616 can include any transparent material, or combination of desired materials, such as polymeric material, and/or ceramic material such as sapphire or glass. In some examples, the display assembly 1616 can include a display component, such as a liquid crystal display (LCD) component or a light emitting diode (LED) display component. In some examples, the display assembly 1616 can include a touch sensitive layer and/or one or more touch sensors. In some examples, the display assembly 1616 can be received by, and/or be attached to, the band 1602 by one or more attachment features.

The device 1600 can include internal components, such as a system in package (SiP) 1626, including one or more integrated circuits such as a processors, sensors, and memory. The device 1600 can also include a battery 1624 housed in the internal volume of the device 1600. Additional components, such as a haptic engine 1622, can also be included in the device 1600. In some examples, one or more of these internal components can be mounted to a circuit board 1620 that can be joined or affixed to other components of the device 1600, such as the band 1602. In some examples, and as described herein, one or more of the components such as the SiP 1626 and the battery 1624 can include nanotwinned metallic alloy materials. In some examples, the device 1600 can include additional components that include nanotwinned metallic alloy materials. For example, the device 1600 can include an electrical connector receptacle 1650 and/or a camera module 1660 that include nanotwinned metallic alloy materials.

The electronic device 1600 can further include a support component 1630, also referred to as a support plate, back plate, or chassis, that can perform a number of functions. For example, the support component 1630 can provide structural support for the electronic device 1600. The support component 1630 can include a rigid material, such as a metal or metals, as described herein. In some examples, the support component 1630 can aid in the thermal management of the device 1600, such as by acting as a thermal spreader or heat sink for one or more components of the device. In some examples, the support component 1630 can include a nanotwinned metallic alloy material than can transport thermal energy or heat from a component of the device 1600 to one or more other desired locations or other components of the device 1600. For example, the SiP 1626 can produce a thermal load during operation and can be thermally coupled to the support component 1630. At least some of the thermal load of the SiP can be transferred to the support component 1630, whereupon this thermal energy can be distributed throughout the support component 1630 and/or to one or more other components connected thereto.

In some examples, the support component 1630 can include nanotwinned metallic copper alloy material. The support component 1630 can be physically, electrically, and/or thermally coupled to the band 1602. In this manner, the support component 1630 can, for example, provide an electrical grounding path for components electrically coupled to the support component 1630, such as a compass or an antenna. The support component 1630 can also include one or more attachment features such that one or more components of the electronic device 1600 can be attached to the support component 1630, for example, by fasteners and/or by welding, as described herein. In some examples, the support component 1630 can be joined to the band 1602 of the device 1600 at one or more locations by any desired method, such as welding. The advantageous properties of the nanotwinned metallic alloy materials described herein can allow for the support component 1630 to achieve desired levels of thermal and electrical conductivity, while also providing desired levels of mechanical support.

An exterior surface of the electronic device 1600 can further be defined by a back cover 1640 that can be coupled to one or more other components of the device 1600. In this regard, the back cover 1640 can combine with the band 1602 to form an enclosure or housing of the electronic device 1600, with the enclosure or housing (including band 1602 and back cover 1640) at least partially defining an internal volume. The back cover 1640 can include a transparent material such as glass, plastic, sapphire, or combinations thereof. An inner portion of the back cover 1640 can be bonded, such as with an adhesive, to the support component 1630. The portion of the support component 1630 that is bonded to the back cover 1640 can protrude relative to other peripheral portions thereof, so that welds can be provided within a space that can be between the support component 1630 and the back cover 1640 when the device 1600 is assembled. This clearance can allow the parts to be assembled without interference between welds on the support component 1630 and the back cover 1640. Additionally, or alternatively, the back cover 1640 can be bonded directly to the band 1602 or coupled to the band 1602 by an interference or other mechanical engagement.

Figure 12A:
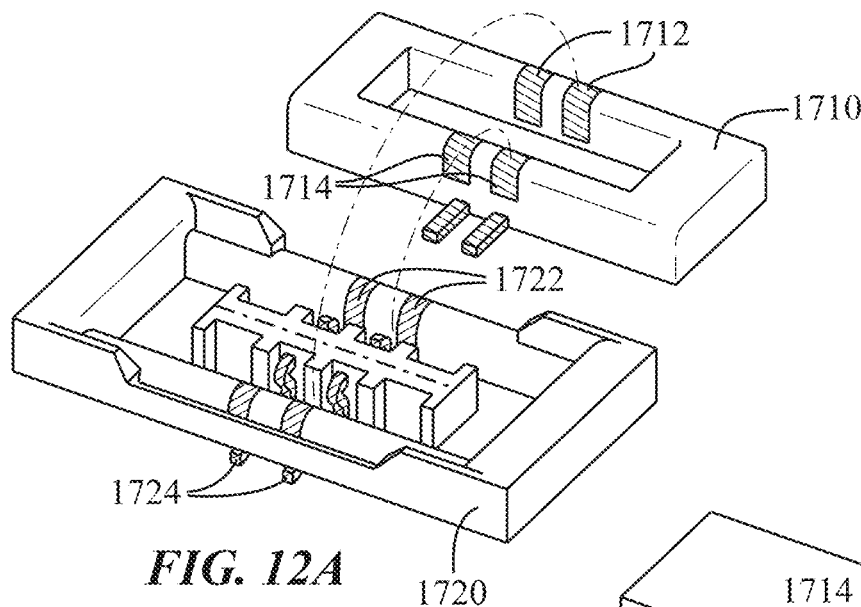
FIG. 12A shows a perspective view of electrical connectors of an electronic device.

FIG. 12A illustrates a perspective view of a first electrical connector 1710 and a second corresponding electrical connector 1720. In some examples, the electrical connectors 1710 and 1720 can be designed to interlock and connect with one another such that an electrical connection is formed therebetween. In some examples, the connectors 1710 and 1720 can be electrically coupled to one or more components of an electronic device, such as device 1600, and can be used to electrically couple or connect the components to one another. For example, the electrical connector 1710 can be coupled to, or can be a part of a component such as the SiP 1626 described with respect to FIG. 11B, while the connector 1720 can be coupled to, or can be a part of a component such as the PCB 1620. In some examples, the connectors 1710, 1720, can be board-to-board connectors, or can couple any other components or a device together.

In some examples, the connector 1710 can include first electrical contact portions 1712 and second electrical contact portion 1714. In some examples, these contact portions 1712, 1714 can include nanotwinned metallic alloy material, such as nanotwinned Cu—Ag alloys. Similarly, the connector 1720 can include first contact portions 1722 designed to contact and couple with first contact portions 1712, and second contact portions 1724 designed to contact and couple with second contact portions 1724. The contact portions 1722, 1724 can also include or be formed from nanotwinned metallic alloy material, such as nanotwinned Cu—Ag alloys described herein.

Figure 12B:
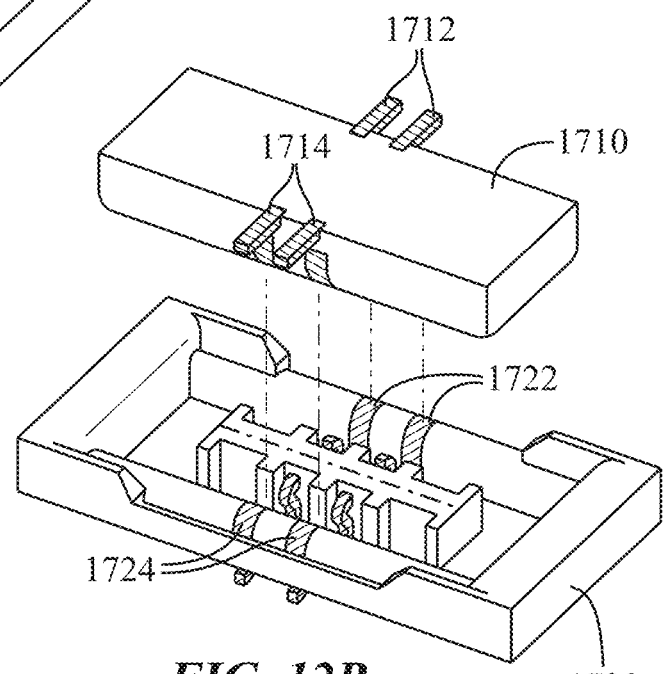
FIG. 12B shows a perspective view of the electrical connectors of FIG. 12A arranged prior to being connected.
Figure 12C:
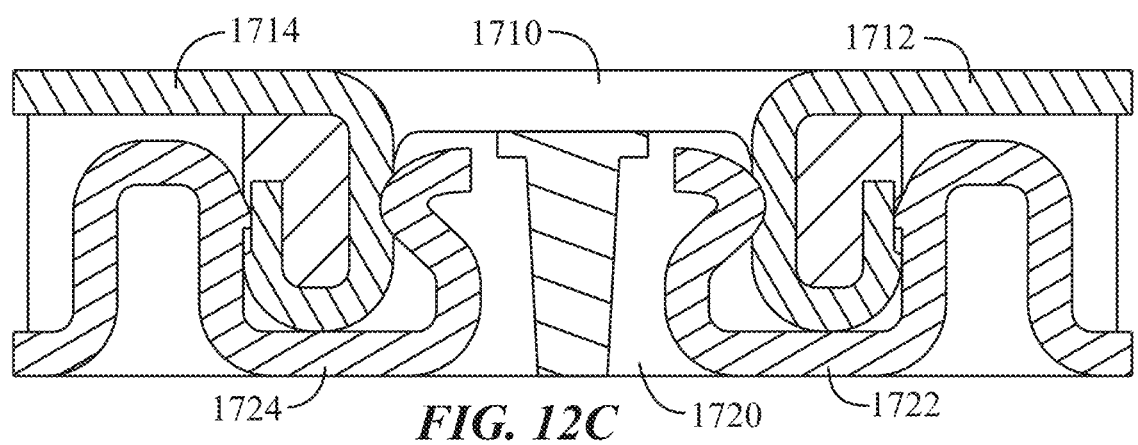
FIG. 12C shows a cross-sectional view of the electrical connectors of FIG. 12A in a connected arrangement.

FIG. 12B shows a perspective view of the electrical connectors 1710, 1720 arranged opposite and in line with one another prior to being connected, for example, as they might be arranged prior to assembly of the components of an electronic device. As can be seen, the connector 1720 can receive the connector 1710 and the contact portions 1712, 1714, and 1722, 1724 of each connector can be configured to mechanically and electrically contact one another. FIG. 12C shows a cross-sectional view of the electrical connectors 1710, 1720 in a connected state. As can be seen, the contact portions 1712, 1714, 1722, 1724 can overlap one another and can be designed to deform slightly to provide a secure connection therebetween. Accordingly, the material forming the contact portions 1712, 1714, 1722, 1724 must be strong enough to withstand the connection process without degradation or breakage while still providing high levels of electrical conductivity to allow for an efficient electrical connection. While some materials, such as non-nanotwinned copper or non-alloy materials can achieve desired levels of electrical conductivity, the relatively low mechanical strength of this material means that the contact portions 1712, 1714, 1722, 1724 must be relatively large in order to ensure they can withstand the connection process. In some examples, however, where the contact portions 1712, 1714, 1722, 1724 include nanotwinned metallic alloy material, the contact portions 1712, 1714, 1722, 1724 can be designed to have much smaller dimensions that nevertheless still possess the requisite mechanical properties to ensure a desirable connection. Accordingly, the use of nanotwinned metallic alloy materials in the connectors 1710, 1720 can allow for the connectors to be significantly reduced in size as compared to connectors that include non-nanotwinned metals. Further details regarding electrical components including nanotwinned metallic alloy materials are described with respect to FIGS. 13A-13C.

Figure 13A:
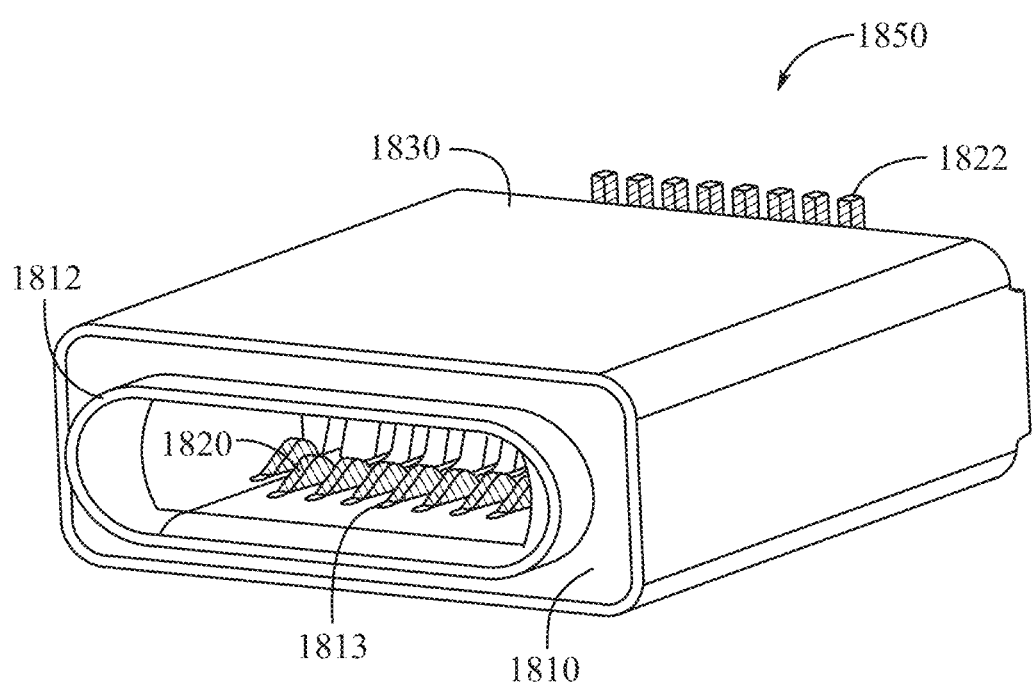
FIG. 13A shows a perspective view of an electrical component of an electronic device.

FIG. 13A illustrates a connector receptacle 1850. The connector receptacle can include some or all of the features of any of the components described herein, such as including a nanotwinned metallic alloy material, and can be substantially similar to the connector receptacle 950 described with respect to FIG. 11B. The connector receptacle 1850 can include a housing 1830 having a front guide 1810 forming a front opening 1812. In some examples, a connector insert can be inserted into the connector receptacle 1850 via the opening 1812 in the front guide 1810. A number of contacts 1820 can be located in slots or passages 1813 in the housing 1830. The connector receptacle 1850 can also include additional contact structures, such as side ground contacts that can be exposed through side openings in the housing 1830. The contacts 1820 and the side ground contacts can provide a retention force when a connector insert is inserted into this connector receptacle 1850. The housing 1830 can also include posts 1822. The posts 1822 can be electrically coupled to other components of an electronic device, for example, by placement in openings of a printed circuit board, device enclosure, or other appropriate substrate for mechanical stability.

Electrical signals and/or power can be conveyed from a connector insert to the contacts 1820 at high data and/or power rates. Also, a relatively large number of signals can be packed into a fairly small connector receptacle 1850. In some examples, in order provide high levels of signal integrity and quality, as well as highly efficient power transmission, the contacts 1820 can be formed from a material having high levels of electrical conductivity, such as a nanotwinned metallic alloy material. For example, the contacts 1820 can be formed from nanotwinned Cu—Ag alloy materials described herein. The resulting contacts 1820 can have a lower impedance or resistance but can also have desirable levels of mechanical properties that can allow the contacts 1820 to provide a strong beam spring force when engaging with a connector insert. Accordingly, because of the efficiencies provided by the high electrical conductivity of the contacts 1820 and the relatively high levels of mechanical strength, the contacts 1120 can be thinner, shorter, and/or smaller in any number of dimensions as compared to similar contacts formed from non-nanotwinned and/or non-alloyed materials, while providing similar or even improved levels of performance.

Figure 13B:
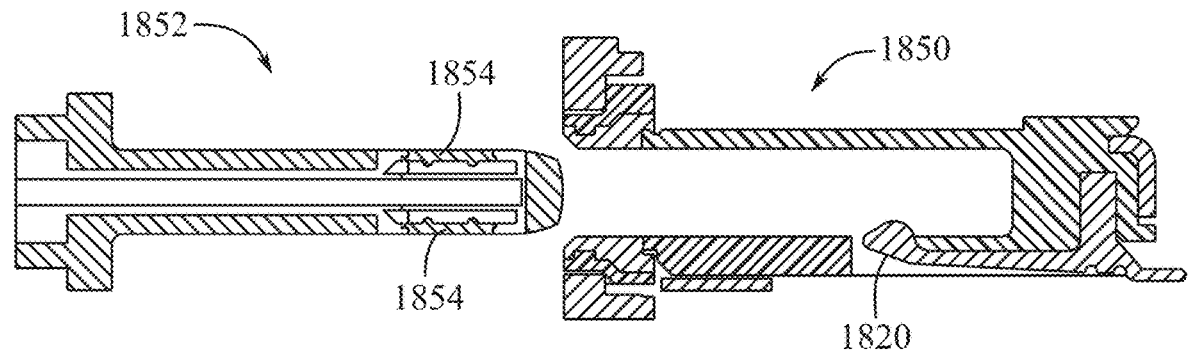
FIG. 13B shows a cross-sectional view of the electrical component of FIG. 13A arranged to receive another electrical component.
Figure 13C:
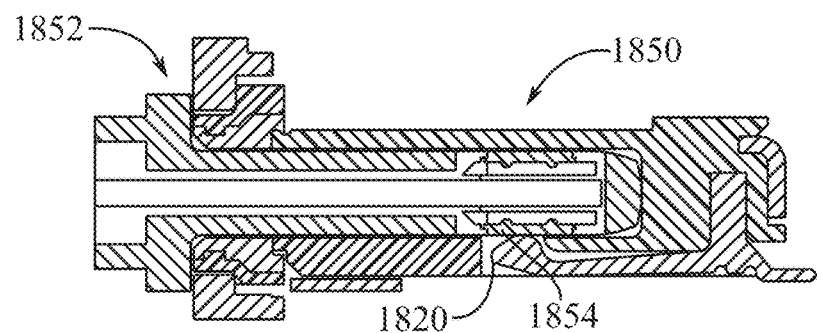
FIG. 13C shows a cross-sectional view of the electrical component of FIG. 13A receiving another electrical component.

FIGS. 13B-13C are simplified cross-sectional views of the mating process of a connector insert 1852 and a connector receptacle 1850. FIG. 13B shows the connector insert 1852 and connector receptacle 1850 prior to insertion of the connector insert 1852 into the opening 1812 of the connector receptacle 1850 shown in FIG. 13A. FIG. 13C shows the connector insert 1852 fully inserted into the connector receptacle 1850 such that contact portion 1854 of the connector insert 1852 is in electrical contact with the contacts 1820 of the connector receptacle 1850. In some examples, the contact portion 1854 of the connector insert 1852 can include a nanotwinned metallic alloy material, such as nanotwinned metallic Cu—Ag alloys. The increased electrical conductivity provided by the nanotwinned metallic alloy material of the contacts 1820 and the contact portions 1854 can have a synergistic effect, providing high levels of efficiency in data and power that are transmitted from the connector insert 1852 to the connector receptacle 1850, and on to other components of the electronic device including the connector receptacle 1850.

As can also be seen in FIGS. 13B and 13C, the contacts 1820 of the connector receptacle 1850 can have a spring bias such that they are in an elevated position when connector insert 1852 is not inserted, and in a depressed or downward second position (shown in FIG. 13C) when the connector insert 1852 is inserted. This bias can aid in maintaining contact between contacts 1820 and contact portion 1854 throughout the life of connector receptacle 1850. In order to provide such a function, however, the materials of the contacts 1820 must have desired levels of mechanical strength and durability in addition to desired electrical properties. Accordingly, the nanotwinned metallic alloy material forming the contacts 1820 can provide such properties. Further details of a component of an electronic device including nanotwinned metallic alloy material are provided with respect to FIG. 14.

Figure 14:
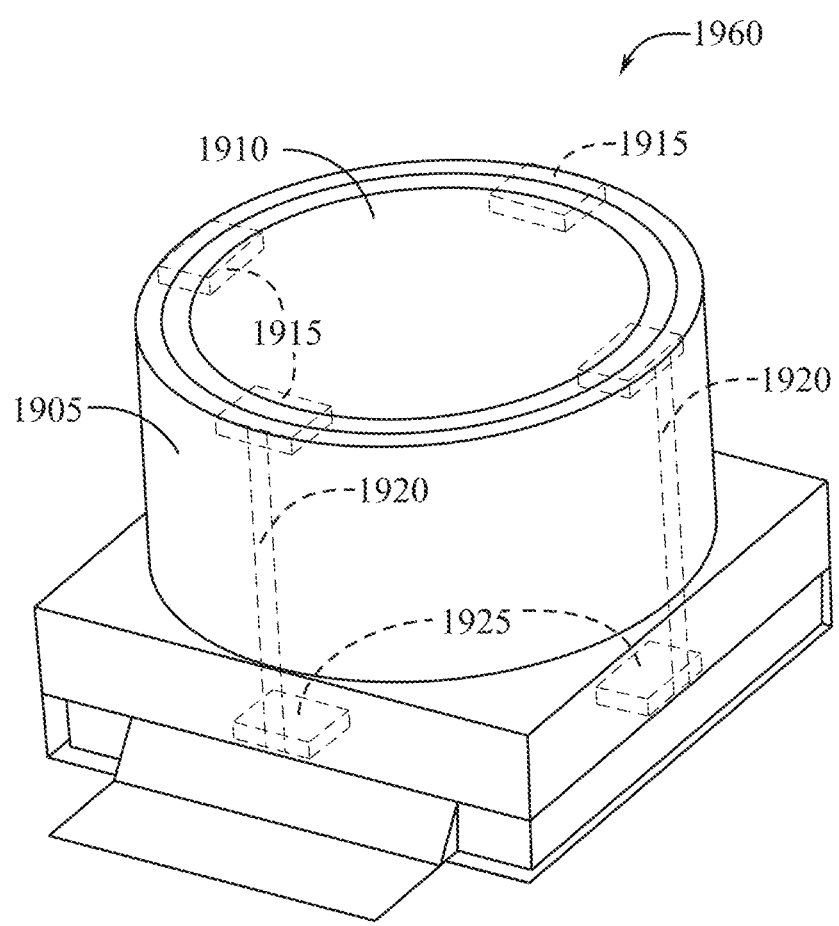
FIG. 14 shows a perspective view of an electronic component.

FIG. 14 is a perspective view of a schematic diagram of a camera module 1960. The camera module 1960 can include some or all of the features of any of the components described herein, and can be substantially similar to the camera module 960 described with respect to FIG. 18B. In some examples, the camera module 1960 can include a lens barrel holder 1905, which can extend upward around the outer circumference of solid state lens 1910, thereby providing a physical barrier to guard the edges of the solid state lens 1910 and helping to minimize the likelihood of the solid state lens 1910 being damaged when the camera module 1960 makes contact with external objects.

In some examples, the lens barrel holder 1905, or other locations on the camera module 1960, can include multiple respective contact areas corresponding to multiple electrically conductive connections 1915. In some examples, the conductive connections 1915 can be located at least partially below the solid state lens 1910 and can make both physical and electrical contact with the solid state lens 1910. Similarly, multiple respective lower conductive connections 1925 can be attached to the conductive connections 1915 through respective conductive interconnects 1920.

In some examples, the electrically conductive connections 1915, lower conductive connections 1925, and/or conductive interconnects 1920 can include nanotwinned metallic alloy material, such as nanotwinned Cu—Ag alloys. In some examples, the electrically conductive connections 1915, lower conductive connections 1925, and/or conductive interconnects 1920 can be formed by a laser direct structuring (LDS) or other additive manufacturing process. In some examples, such as where formed by a LDS process, a laser can trace the desired locations (e.g., channels) of the interconnect electrical traces along the wall of lens barrel holder 1905 and a subsequent nanotwinned metallic material deposition step (e.g., electrodeposition or electroforming, as described herein) causes the nanotwinned metallic material to be deposited onto and adhere to the traced channels on the inner surface of the wall of lens barrel holder 1905 to a desired thickness.

In some examples, the electrically conductive connections 1915, lower conductive connections 1925, and/or conductive interconnects 1920 including nanotwinned metallic alloy materials can transmit various types of control signals, provide electrical power, and/or provide electrical grounding between the solid state lens 1910 and a substrate of the camera module 1960, or between other components of an electronic device including the camera module 1960, thereby enabling communication with one or more processor(s), other control modules, electrical power sources, and/or electrical ground connections. As described herein, the levels of mechanical strength and electrical conductivity provided by the nanotwinned metallic alloy material of the electrically conductive connections 1915, lower conductive connections 1925, and/or conductive interconnects 1920 can allow for rapid and efficient transmission of high power levels and/or large amounts of information to the camera module 1960. In some examples, the use of the electrically conductive connections 1915, lower conductive connections 1925, and/or conductive interconnects 1920 including nanotwinned metallic alloy materials can allow for the camera module 1960 to operate and capture images rapidly, reliably, and at high speeds.

Any number or variety of electronic device components can include a nanotwinned metallic alloy material. The process for forming such a nanotwinned metallic alloy material, for example, forming nanotwinned metallic alloy material having a thickness greater than 50 microns, can include depositing the nanotwinned metallic alloy material onto a carrier to a desired thickness, as described herein. The nanotwinned metallic alloy material can be formed into a desired shape during deposition and/or can be subjected to manufacturing processes or treatments to achieve a desired shape, for example, to form all or a portion of an electronic component. Various example components including nanotwinned metallic alloy materials are described below with reference to FIGS. 15A-B.

Figure 15A:
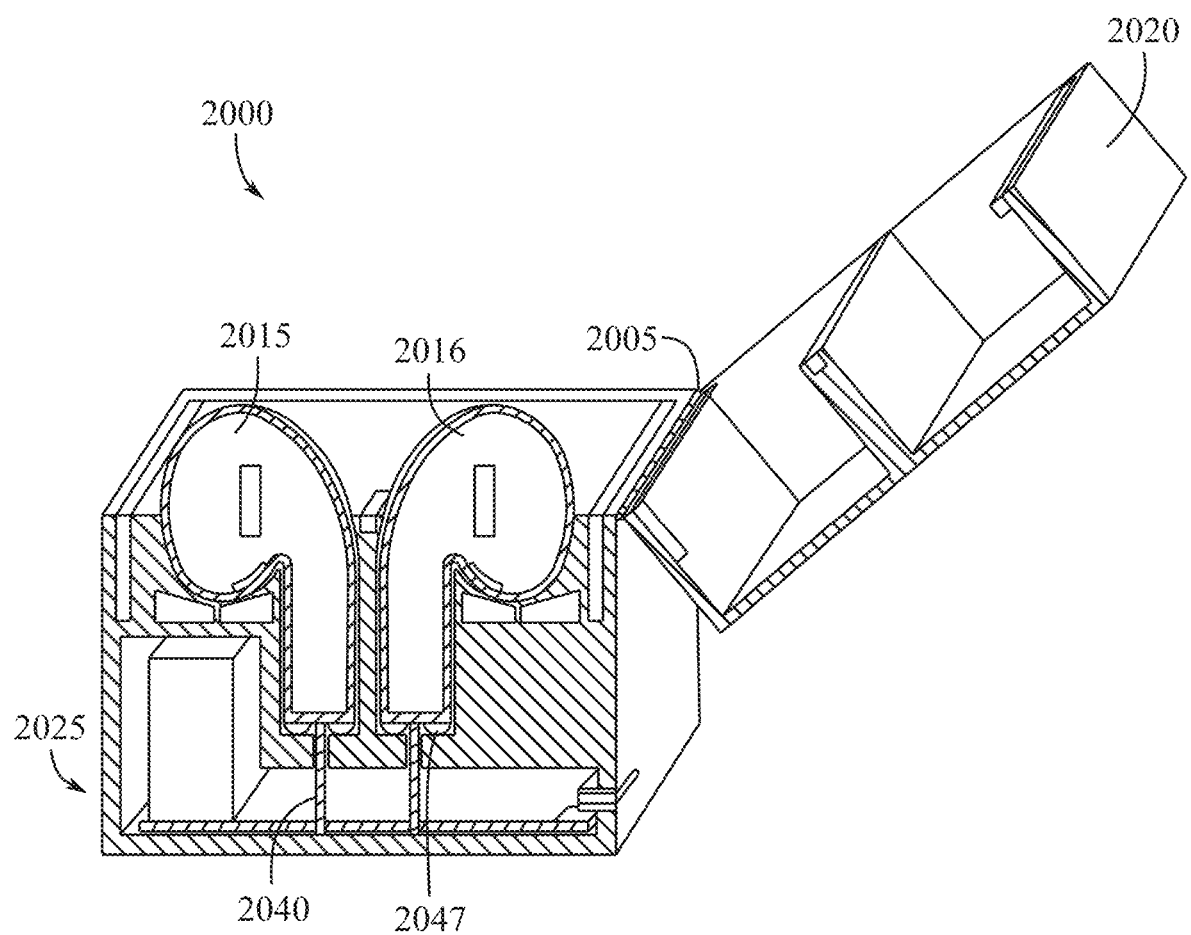
FIG. 15A shows a cross-sectional view of an electronic device.

FIG. 15A depicts a simplified plan view of a case 2000 for a pair of wireless earbuds 2015, 2016. The case 2000 and wireless earbuds 2015, 2016 can include some or all of the features of the components described herein. As shown in FIG. 15A, the case 2000 can include a housing 2025, also called a body, having one or more cavities and configured to receive a pair of earbuds 2015, 2016. In some examples, the cavities can be positioned adjacent to each other on opposite sides of a center plane of case 2000. Each cavity can be sized and shaped to match that of its respective earbud 2015, 2016.

In some examples, the case 2000 can further include a lid 2020 attached to the housing 2025. The lid 2020 can be operable between a closed position where lid 2020 is aligned over one or more cavities of the housing 2025 fully enclosing pair of earbuds 2015, 2016 within the housing 2025, and an open position, as shown, where the lid 2020 is displaced from the housing 2025 and cavities such that a user can remove the earbuds 2015, 2016 from the cavities or replace the earbuds within the cavities. The lid 2020 can be pivotably attached to the housing 2025, for example, by a hinge component 2005 and can include a magnetic or mechanical system (not shown) that provides the lid 2020 with a bi-stable operation. In some examples, the case 2000 can also include a charging system configured to charge pair of earbuds 2015, 2016. In some examples, the case 2000 can thus include a battery or other electrical power source (not shown) and can include one or more electrical contacts 2040 that can be electrically coupled to the power source. In some examples, when the earbuds 2015, 2016 are inserted into the cavities of the housing 2025, electrical contacts 2047 on each earbud can form an electrical connection with the contacts 2040 to provide electrical power to the earbuds 2015, 2016, for example, to charge a battery or other power source contained therein.

Figure 15B:
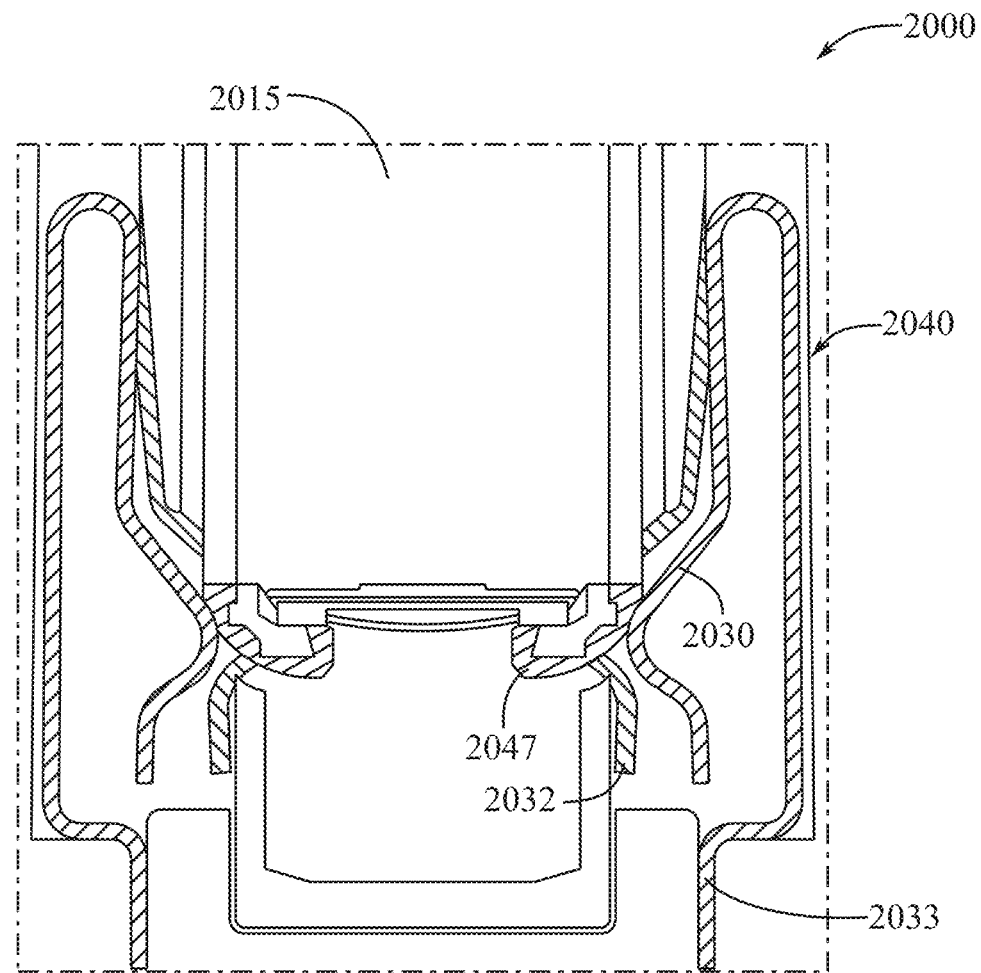
FIG. 15B shows a close-up cross-sectional view of the electronic device of FIG. 15A.

FIG. 15B illustrates a close-up cross-sectional view of the case 2000 including an earbud 2015 disposed in a cavity thereof. The case 2000 can include a case connector or contact 2040 that can be incorporated into the earbud case 2000 and an electrical earbud connector or contact 2047 disposed at the end of a stem portion of an earbud 2015. Some or all of the components of a case connector 2040 can make electrical contact with electrical earbud connector 2047 to provide electrical power to the earbud 2015.

The combination of arcuate surfaces on the earbud contact 2047 and earbud case contact 2040 enable a contact wiping motion each time the earbuds 2015, 2016 are inserted within and drawn out of the case 2000, creating a reliable interconnect. In FIG. 15B, a portion 2030 of the case contact 2040 is illustrated in a deflected state that shows its approximate position when earbud 2015 is fully inserted into its receiving cavity such that the earbud contact 2047 is engaged with the earbud case connector or contact 2040.

During a mating event, as earbud 2015 is inserted deeper into the earbud receiving cavity, the earbud case contact 2040 can come into physical and/or electrical contact with the earbud contacts 2047 and deflect outward. The exterior contacting surfaces of the earbud contacts 2047 and earbud case contacts 2040 rub against each other during both the mating event and during a de-mating event when the earbud 2015 is withdrawn from the earbud receiving cavity. In some examples, the earbud case contact 2040 can also include a base contact portion 2032 that can contact a second location of the earbud contact 2047 to provide a reliable connection. Further, the earbud case contact 2040 can include a connection 2033 to connect the portions 2032, 2030 to a power source of the case 2000.

In some examples, some or all of the earbud case contact 2040, such as portions 2030, 2032, 2033, and the earbud contact 2047 can be formed from or include nanotwinned metallic alloy materials, such as nanotwinned metallic Cu—Ag alloy materials described herein. In addition to the electrical efficiencies provided by the high electrical conductivity of the nanotwinned metallic alloy material, it can also be advantageous to form the contacts 2040, 2047 from nanotwinned metallic alloy material because of the high levels of physical wear that the wiping motion caused by insertion and removal of the earbuds 2015, 2016 can cause. The high hardness and strength of a nanotwinned metallic alloy material, as described herein, can ensure that these contacts do not degrade or become undesirably worn over time, thereby ensuring electrical contact throughout the life of the case 2000.

Additionally, in some examples, the earbuds 2015, 2016 can include a magnet or magnetic component that can be attracted to at least one housing magnetic component disposed within case 2000. The attraction can be strong enough to magnetically secure the earbuds 2015, 2016 into their respective cavities. In order for this magnetic retention system to operate as desired, it can be advantageous for the contacts 2040, 2047 and other components of the case 2000 to be formed from non-ferromagnetic materials. Nanotwinned metallic Cu—Ag alloys, being non-ferromagnetic, can thus provide the advantages described above without interfering with the magnetic retention system of the case 2000.

Any number or variety of electronic device components can include a nanotwinned metallic alloy material. The process for forming such a nanotwinned metallic alloy material, for example, forming nanotwinned metallic alloy material having a thickness greater than 50 microns, can include depositing the nanotwinned metallic alloy material onto a carrier to a desired thickness, as described herein. The nanotwinned metallic alloy material can be formed into a desired shape during deposition and/or can be subjected to manufacturing processes or treatments to achieve a desired shape, for example, to form all or a portion of an electronic component. Various example components including nanotwinned metallic alloy materials are described below with reference to FIGS. 16-17B.

Figure 16:
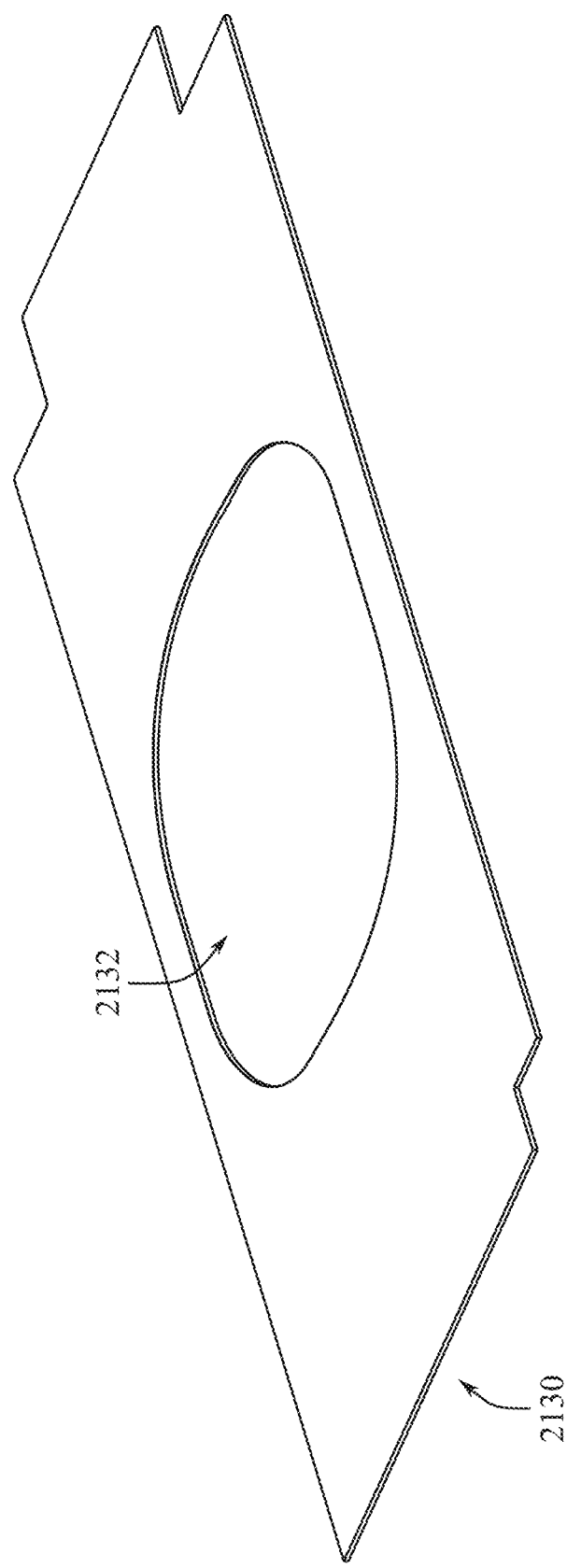
FIG. 16 shows a component of an electronic device.

FIG. 16 illustrates a perspective view of a support component 2130 that can be substantially similar to, and can include some or all of the features of, the support component 930 described herein. The support component 2130 can have a substantially planar or flat shape or profile. That is, the support component 2130 can have a desired shape extending in any amount of desired distances and configurations in two dimensions, while having a substantially uniform height or thickness in a third dimension perpendicular to the first two dimensions. Thus, in some examples, the support component 2130 can include a plate, a sheet, or another substantially planar structure having any desired peripheral profile. The support component 2130 can have a substantially planar shape or profile but can nevertheless include one or more non-planar portions or features, such as protrusions, bumps, flanges, combinations thereof, or any other desired features. Further, in some examples, the support component 2130 can define a first surface, also referred to as a top surface (shown), and a second surface opposite the first surface, also referred to as the bottom surface (not shown).

In some examples, the support component 2130 can define one or more apertures or through-holes, such as an aperture 2132 disposed at any desired location on the support component 2130. In some examples, the aperture 2132 can allow components or electromagnetic radiation to pass through the support component 2130 at the location of the aperture 2132, as described herein. In some examples, the support component 2130 can include or define one or more attachment features or locations. For example, all or a portion of the periphery of the support component 2130 can be shaped to provide attachment features or locations for one or more other components of an electronic device, as described herein. In some examples, components can be attached to the support component 2130 at any location, such as at a location along the periphery of the support component 2130, or to one or more surfaces thereof, by welding, joining, bonding, adhering, or any other desired form or combination of forms of attachment.

In some examples, the support component 2130 can be formed from, or can include, a nanotwinned metallic alloy material, such as nanotwinned Cu—Ag alloys described herein. In some examples, the support component 2130 can be a monolithic or unitary piece of nanotwinned metallic alloy material. It can be desirable for a structural component that can support one or more components in an electronic device and/or provide stiffness and rigidity to the device, such as the support component 2130, to also have desired thermal conduction properties, thereby allowing the support component 2130 to serve as a heat sink and/or thermal spreader for the operational components that are thermally coupled to the support component. The mechanical and thermal conduction properties of the nanotwinned metallic alloy materials described herein can thus allow for the support component 2130 to perform these functions without the need for additional structural materials or components.

In some examples, the support component 2130 can have a thickness between about 50 microns and about 1000 microns, between about 100 microns and about 500 microns, or between about 150 microns and about 250 microns. In some examples, the support component 2130 can have a thickness of about 200 microns or less. Additional details of structural components of an electronic device as described with respect to FIGS. 17A-17B.

Figure 17A:
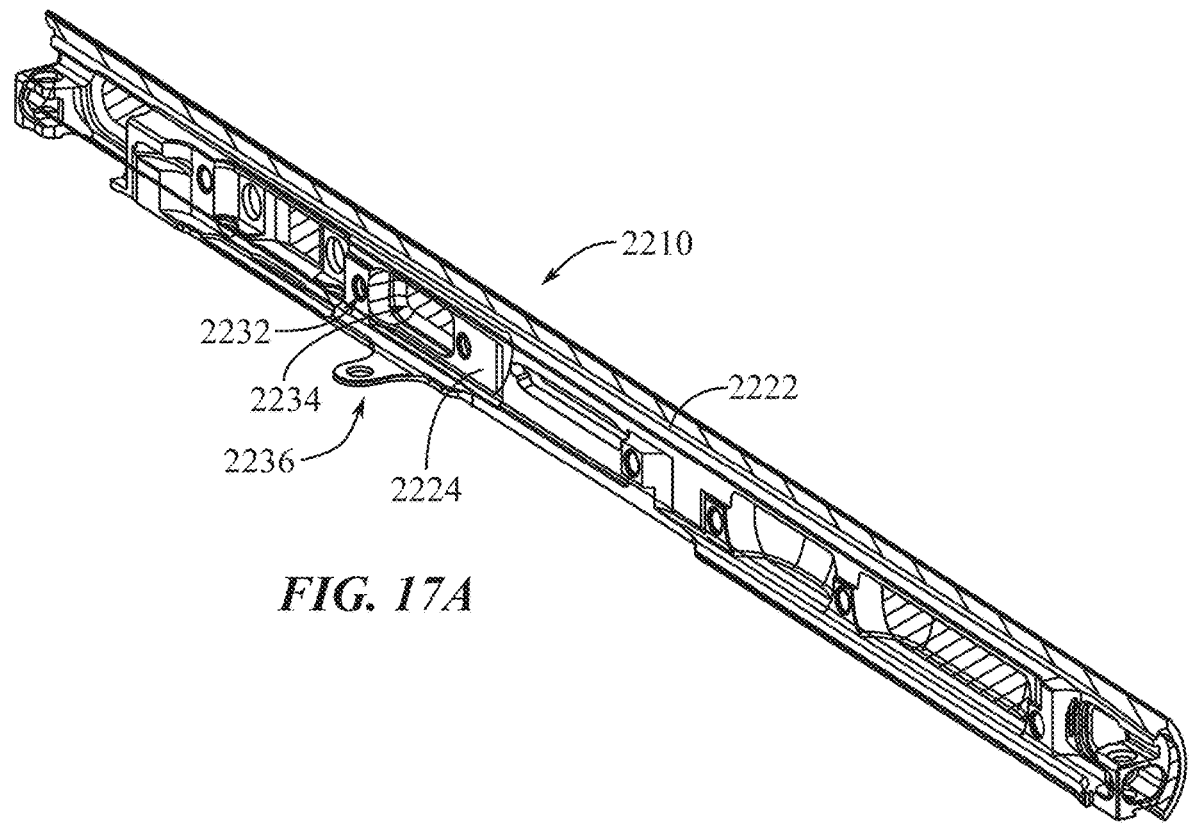
FIG. 17A shows a perspective view of a component of an electronic device.

FIG. 17A shows a sidewall component 2210 that can be similar to or include the features of the composite sidewall components 1604, 1606, 1608, 1610 described with respect to FIG. 11B. The sidewall component 2210 can include an outer or exterior portion 2222 that is joined to an inner or interior portion 2224. In the present example, the exterior portion 2222 can at least partially define an exterior surface of a housing or enclosure of an electronic device. The interior portion 2224 can at least partially define a surface of an internal volume of the electronic device. As can be seen in FIG. 17A, the composite component 2210 can include a number of features 2232, 2234, 2236, that can, for example, act as attachment features for other components of an electronic device, to provide a mechanical, thermal, and/or electrical connection therebetween.

In some examples, the interior portion 2224 of the component 2210 can be selected such that it has a set of material properties that can allow for mechanical support of components attached thereto, while also providing high levels of thermal and/or electrical conductivity. Thus, in some examples, the interior portion 2224 can be formed from or include a nanotwinned metallic alloy material, such as nanotwinned metallic Cu—Ag alloys described herein. In some examples, the interior portion 2224 including nanotwinned metallic alloy material can act as a heat sink or other form of thermal management component for any components attached thereto. Additionally, the high levels of mechanical strength provided by the nanotwinned metallic alloy material can allow for components to be securely attached to features 2232, 2234, 2236 and can allow for the component 2210 to also provide mechanical support. Further, the material of the exterior portion can be selected to have a material property or set of material properties, independent of the material properties of the interior portion, that allow the exterior portion 2222 to have, for example, high levels of hardness and corrosion resistance and/or a desired cosmetic appearance.

In some examples, the features formed in one or both of exterior portion 2222 and interior portion 2224, such as features 2232, 2234, 2236, can have a major dimension from about a micron up to about a millimeter, or several millimeters or more. In some cases, a feature, such as feature 2236 can have a major dimension from about 100 microns to about 1 millimeter. Further, in some examples, a feature, such as feature 2236, can have minor dimensions from about 100 microns to about 1 millimeter.

Further, as can be seen in FIG. 17A, the exterior portion 2222 can have a substantially curved shape or profile that can correspond to an exterior profile of the electronic device. The exterior portion 2222 can have any shape or profile, as desired. In some examples where the exterior portion 2222 has a substantially curved shape or profile, the interior portion 2224 can be positioned entirely behind or within a curve defining the curved profile of the exterior portion 2222.

Figure 17B:
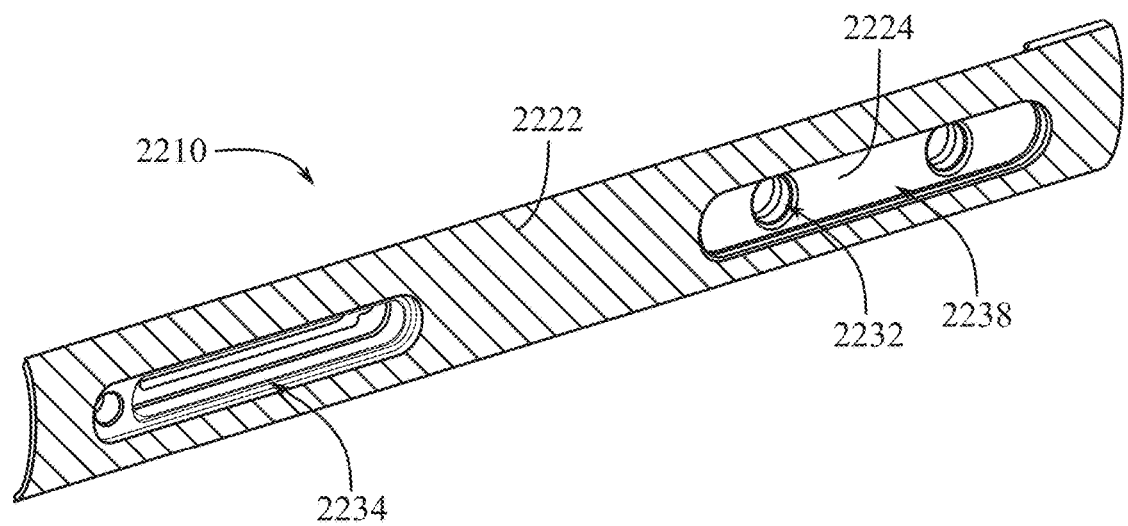
FIG. 17B shows another perspective view of the component of FIG. 17A.

FIG. 17B shows another perspective view of the component 2210. As can be seen in FIG. 17B, one or more areas, such as area 2238, of the exterior portion 2222, can be removed so that at least some of the nanotwinned metallic alloy material forming the interior portion 2224 can be exposed. The exposed surface of the interior portion 2222 can be subjected to a treatment or other processing in order to, for example, protect the exposed surface of the interior portion 2222. Although described as including two portions 2222, 2224, including different materials, in some examples, the component 2210 can be a unitary or continuous component including a nanotwinned metallic alloy material. In some examples, the advantageous mechanical properties of nanotwinned metallic alloy materials can allow for the component 2210 to have desired levels of hardness and durability to function as an exterior surface of an electronic device and to withstand everyday wear.

Any number or variety of electronic device components can include a nanotwinned metallic alloy material. The process for forming such a nanotwinned metallic alloy material, for example, forming nanotwinned metallic alloy material having a thickness greater than 50 microns, can include depositing the nanotwinned metallic alloy material onto a carrier to a desired thickness, as described herein. The nanotwinned metallic alloy material can be formed into a desired shape during deposition and/or can be subjected to manufacturing processes or treatments to achieve a desired shape, for example, to form all or a portion of an electronic component. Various example components including nanotwinned metallic alloy materials are described below with reference to FIGS. 18A-18B.

Figure 18A:
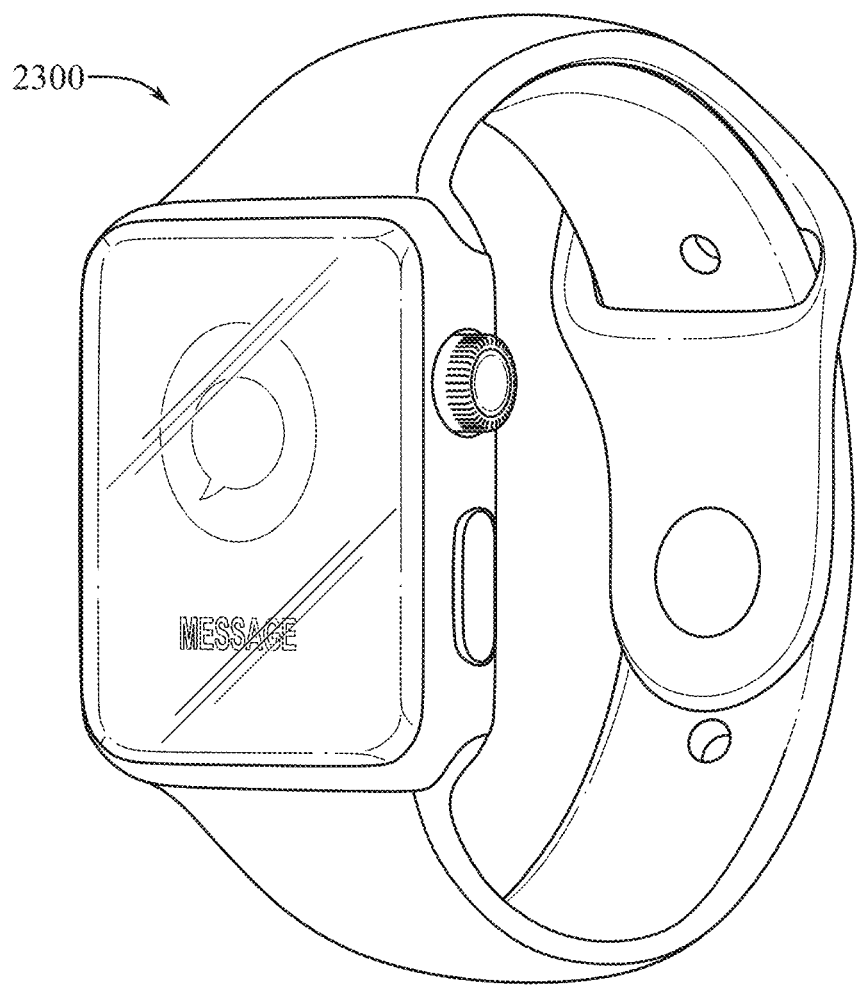
FIG. 18A shows a perspective view of an electronic device.

FIG. 18A shows an example of an electronic device 2300. The electronic device shown in FIG. 18A is a watch, such as a smartwatch. The smartwatch 2300 of FIG. 18A is merely one representative example of a device that can be used in conjunction with the components and methods disclosed herein. The electronic device 2300 can correspond to any form of wearable electronic device, portable media player, media storage device, portable digital assistant ("PDA"), tablet computer, computer, mobile communication device, GPS unit, remote control device, or other device. The electronic device 2300 can be referred to as an electronic device, or a consumer device. Further details of the watch 2300 are provided below with reference to FIG. 18B.

Figure 18B:
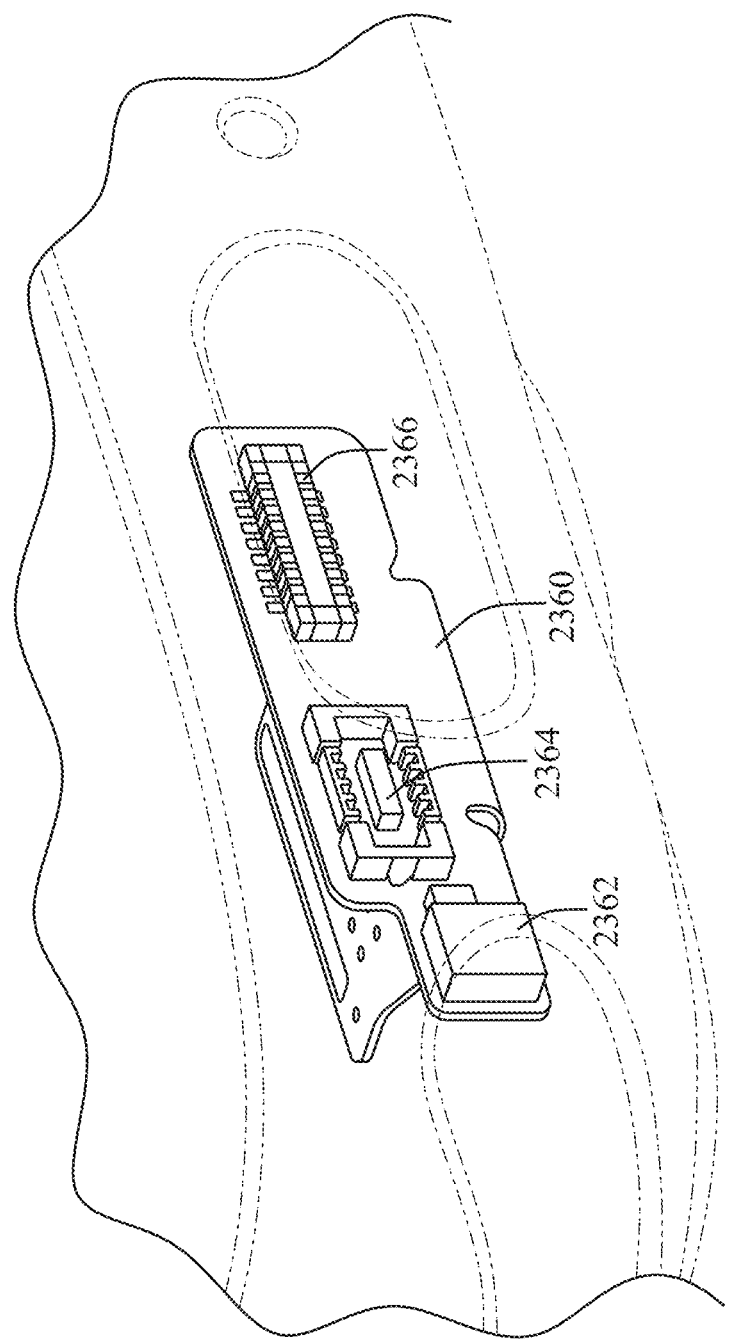
FIG. 18B shows a perspective view of a component of the electronic device of FIG. 18A.

FIG. 18B illustrates a view of a support component 2360 and its position in the internal volume at least partially defined by the housing of the smartwatch 2300 of FIG. 18A. In some examples, the support component 2360 can take the form of a bracket or a brace. The support component 2360 can be affixed to other components of the device 2300 by features such as studs, posts, screws, or any other feature for attachment or securement. In some examples, one or more electronic components or sensors can also be affixed to the support component 2360. For example, the components 2362, 2364, and 2366 can all be affixed to a surface of the support component 2360, as shown, by any desired technique or feature. In some examples, these electronic components 2362, 2364, 2366 can include processors, memory components, sensors, antennas, sound or light emitting components, batteries, or any other desired electronic components. In some examples, the support component 2360 can include a nanotwinned metallic alloy material, such as nanotwinned Cu—Ag alloys described herein. The material properties of the nanotwinned metallic alloy material forming the support component 2360 can allow the support component 2360 to provide desired levels of mechanical support to the components 2362, 2364, 2366, while also managing and distributing the thermal loads generated by the components 2362, 2364, 2366, for example, by distributing or directing heat generated by the components 2362, 2364, 2366 to a desired location or locations, so as to allow for improved levels of device performance.

Any number or variety of electronic device components can include a nanotwinned metallic alloy material. The process for forming such a nanotwinned metallic alloy material, for example, forming nanotwinned metallic alloy material having a thickness greater than 50 microns, can include depositing the nanotwinned metallic alloy material onto a carrier to a desired thickness, as described herein. The nanotwinned metallic alloy material can be formed into a desired shape during deposition and/or can be subjected to manufacturing processes or treatments to achieve a desired shape, for example, to form all or a portion of an electronic component. Various example components including nanotwinned metallic alloy materials are described below with reference to FIGS. 19A-19C.

Figure 19A:
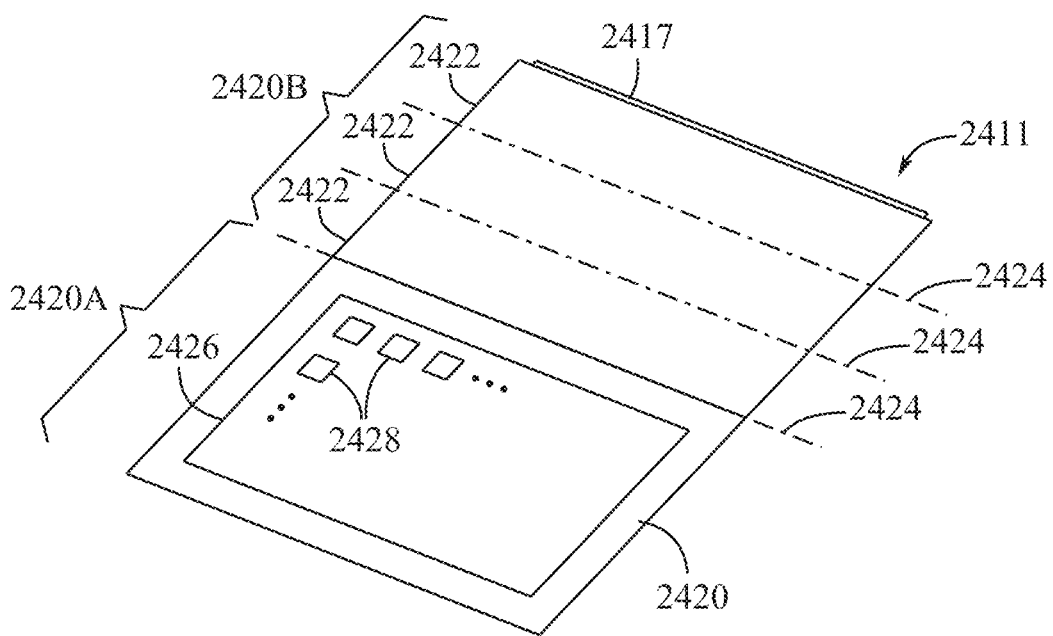
FIG. 19A shows a perspective view of an electronic device and accessory component.
Figure 19B:
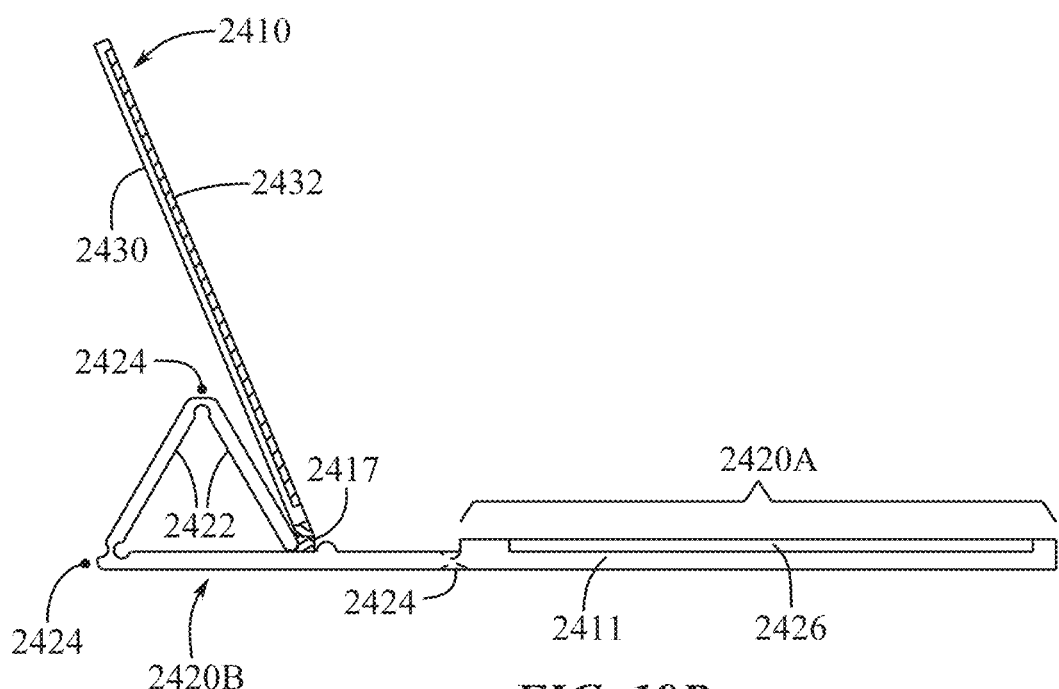
FIG. 19B shows a side view of the electronic device and accessory component of FIG. 19A.

FIG. 19A shows a perspective view of an electronic device accessory component 2411. An electronic device, such as the device 2410 illustrated in FIG. 19B can be coupled to the accessory component 2411 for use therewith. In some examples, the device 2410 can be a tablet computer. The tablet computer 2410 of FIG. 19B is merely one representative example of a device that can be used in conjunction with the systems and methods described herein, and that can include one or more components and/or materials described herein. Electronic device 2410 can correspond to any form of a wearable electronic device, a portable media player, a media storage device, a portable digital assistant ("PDA"), a tablet computer, a computer, a mobile communication device, a GPS unit, a remote-control device, or any other electronic device. The electronic device 2410 can be referred to as an electronic device, or a consumer device.

In some examples, the device 2410 and component 2411 can be used together. For example, the input resource of the input-output component in component 2411 can be used to gather input from a user. This user input can then be conveyed to device 2410 over signal paths for use in controlling the operation of device 2410. As shown in FIG. 19A, component 2411 can be a flexible cover that can be used to protect an electronic device such as a tablet computer or other computing device. In some examples, the component 2411 can include body 2420. The body 2420 can have surfaces formed from plastic, fabric, microfiber embedded in a polymer layer, or other suitable materials. For example, one side of the body 2420 (e.g., the exterior of body 2420 when component 2411 is closed around device 2410) can be formed from a sheet of polymer and the other side of body 2420 (e.g., the inner surface of body 2420) can be formed from a microfiber layer.

The component 2411 can include input-output components such as keyboard 2426, including keys 2428, a touch pad (trackpad) that gathers touch and/or force input, and/or other input-output components. In some examples, the keyboard 2426 can be mounted in lower portion 2420A of the component 2411. In some examples, the upper portion 2420B of the component 2411 can contain foldable sections (horizontal strips) such as sections 2422. In some examples, the sections 2422 can bend about one or more bend axes, such as bend axes 2424. In some examples, the upper portion 2420B can have a connector such as connector 2417 to provide an electrical connection to the device 2410. In some examples, the connector 2417 can mate with a connector that is associated with device 2410. In some examples, the connector 2417 can contain electrical contacts for coupling to corresponding connector contacts in the device 2410. These contacts can be electrically coupled to electrical components in lower portion 2420A such as keyboard 2426 (e.g., one or more integrated circuits for gathering keystroke information during the operation of keys 2428 in keyboard 2426).

To accommodate bending of the housing body 2420 about bend axes 2424, the housing 2420 can be provided with flexible hinge portions along the boundaries between sections 2422 (i.e., along axes 2424). A signal path for coupling connector 2417 to circuitry in keyboard 2426 can run across axes 2424 (i.e., the signal path can cross each of axes 2424 at a right angle so as to extend between connector 2417 and keyboard 2426). In some examples, because the signal path overlaps bend axes 2424, the signal path is preferably formed from a flexible signal path structure. With one suitable arrangement, the flexible signal path structure can be formed from a flexible fabric signal path structure having metal traces on a flexible fabric substrate or having conductive strands of material that are formed as part of the flexible fabric substrate. In some examples, and as described herein, the signal path can include nanotwinned metallic alloy materials.

A cross-sectional side view of component 2411 and an associated electronic device such as device 2410 is shown in FIG. 19B. As shown, the component 2411 can be folded along bend axes 2424 to form a stand for device 2410. In some examples, the device 2410 can have a housing 2430 and a display 2432 that is mounted in housing 2430. The component 2411 can support device 2410 in a position that allows display 2432 to be easily viewed by a user while the user is typing on keyboard 2426. When device 2410 is supported by the component 2411, a connector of the device 2410 can mate with connector 2417 of component 2411. In some examples, one or both of the connector of the device 2410 and the connector 2417 can include nanotwinned metallic alloy materials. In some examples, the component 2411 can bend along axis such as axis 2424 and/or other bend axes that span the width of the component 2411.

Figure 19C:
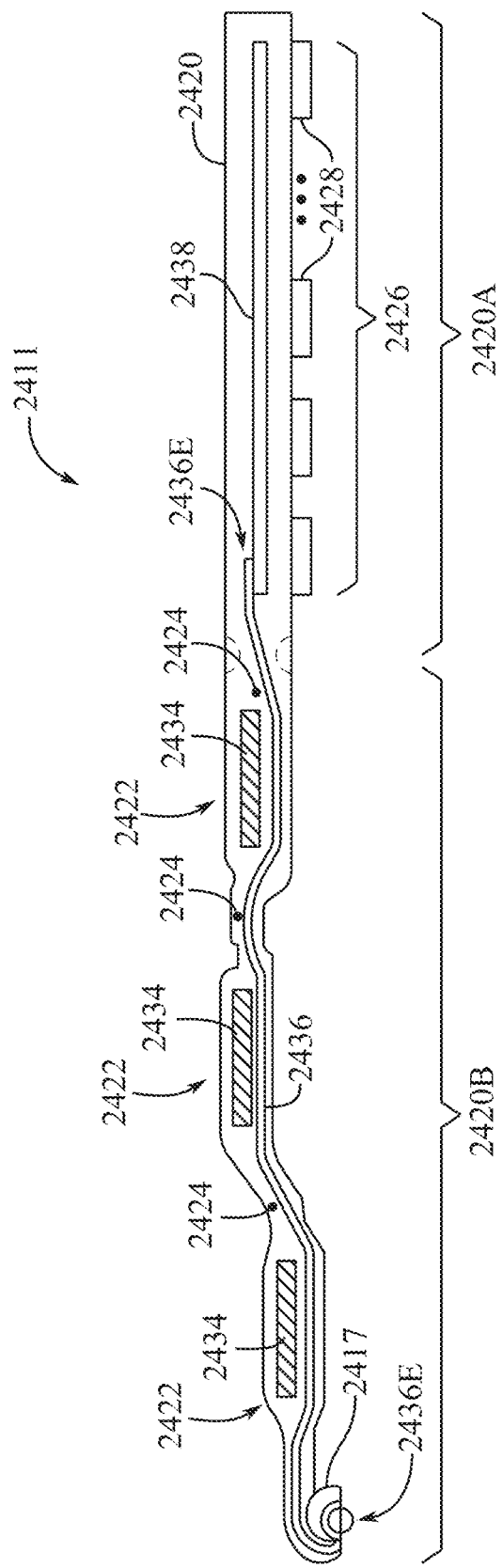
FIG. 19C shows a cross-sectional view of the accessory component of FIG. 19A.

FIG. 19C shows an illustrative cross-sectional side view of the component 2411. In some examples, the component 2411 can include one or more stiffeners, such as fiberglass stiffeners 2434 (e.g., stiff rectangular panels of material). In some examples, a flexible fabric signal path structure 2436 can include ends 2436E that are coupled between the connector 2417 and a printed circuit 2438 or other electronic component of the component 2411. In some examples, the printed circuit 2438 can be located in lower body portion 2420A of body 2420 and can contain circuitry for controlling the operation of keyboard 2426 (e.g., key switches, integrated circuits, signal traces, etc.). In some examples, the flexible fabric signal path structure 2436 can span locally thinned portions of body 2420 that serve as hinges along bend axes 2424.

In some examples, the fabric structure 2436 can include nanotwinned metallic alloy materials and can define one or more signal paths to transmit electrical power and signals. In some examples, the signal paths can be formed from a series of parallel nanotwinned metallic traces that run along the length of fabric structure 2436 (i.e., between connector 2417 and printed circuit 2438) and that serve as a signal bus. In some examples, nanotwinned metallic alloy material can be electroplated, electrodeposited, electroformed, or otherwise manufactured, such as through an LDS process, as described herein to form the traces. Advantageously, the high electrical conductivity and mechanical strength of the nanotwinned metallic alloy material forming the traces can allow for very thin sections of metallic material that can bend and deform with the component 2411, but that can still efficiently transmit power and signals at a desired rate or amount.

Any number or variety of electronic device components can include a nanotwinned metallic alloy material. The process for forming such a nanotwinned metallic alloy material, for example, forming nanotwinned metallic alloy material having a thickness greater than 50 microns, can include depositing the nanotwinned metallic alloy material onto a carrier to a desired thickness, as described herein. The nanotwinned metallic alloy material can be formed into a desired shape during deposition and/or can be subjected to manufacturing processes or treatments to achieve a desired shape, for example, to form all or a portion of an electronic component. Various example components including nanotwinned metallic alloy materials are described below with reference to FIGS. 20A-20C.

Figure 20A:
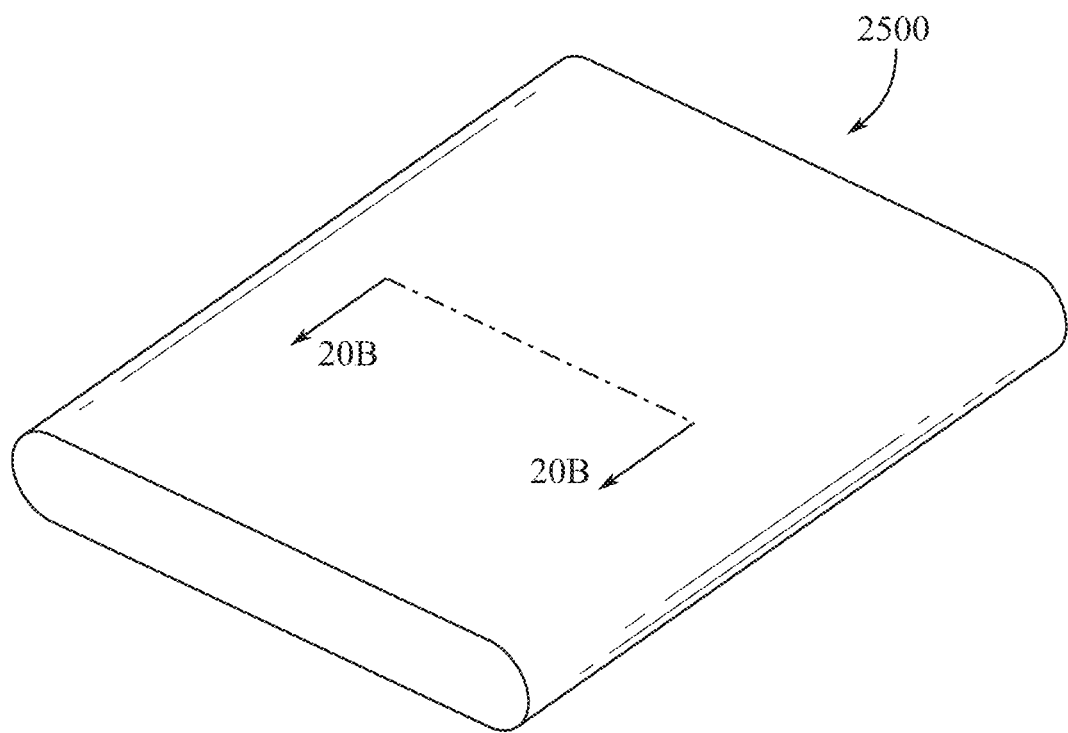
FIG. 20A shows a perspective view of a battery.
Figure 20B:
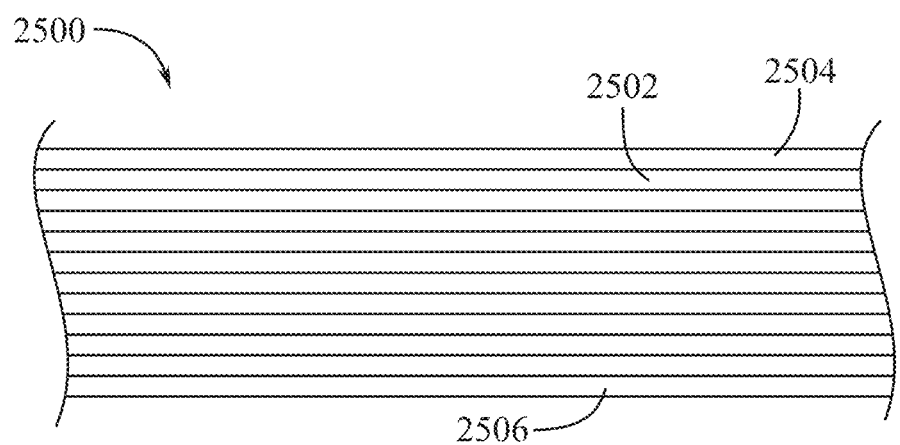
FIG. 20B shows a cross-sectional view of the battery of FIG. 20A.
Figure 20C:
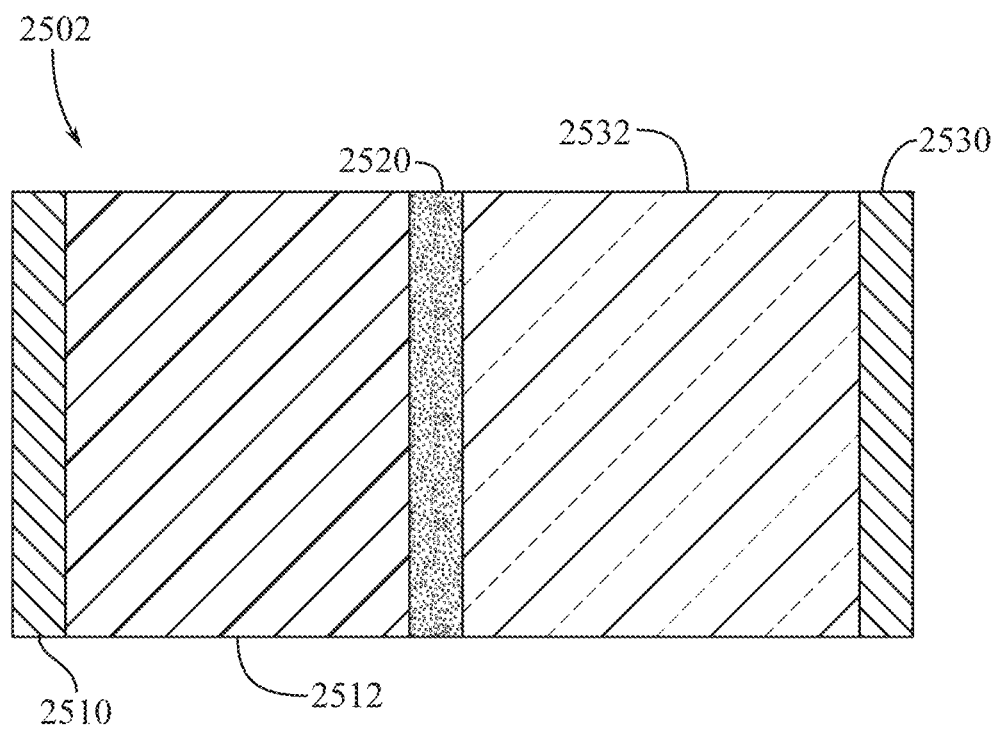
FIG. 20C shows a schematic diagram of a portion of the battery of FIG. 20A.

FIG. 20A illustrates a battery or battery pack 2500. In some examples, the battery 2500 can be a rechargeable battery. In some examples, and as shown in FIG. 20B, the battery 2500 can include a number of electrochemical cells 2502, 2504, 2506. The cells 2502, 2504, 2506 can be coupled in series or parallel and can correspond to rechargeable (e.g., secondary) cells such as nickel-cadmium (Ni—Cd) cells, nickel-metal-hydride (Ni—MH) cells, lithium-ion cells, lithium-polymer, and/or any other form of electrochemical cell now known or discovered in the future. For example, one or more cells 2502, 2504, 2506 can correspond to lithium-ion cells, each of which includes multiple layers (e.g., a cathode with a current collector, a separator, and an anode with a current collector). The structure of a single electrochemical cell 2502 is discussed below with reference to FIG. 20C.

In some examples, an electrochemical cell 2502 can include an anode active material or anode layer 2512 that is secured or bonded to a current collector 2510. The cell 2502 can also include a cathode active material or cathode layer 2532 that is secured or bonded to a current collector 2530. The anode material 2512 and the cathode material 2532 can be separated from one another by a porous separator layer 2520. In some examples, the separator 2520 can include a polymer and can include a conducting electrolyte. In some examples, the cathode material 2532 can include a lithium compound and the current collector 2530 can include a conductive film or foil, such as a metallic foil, for example, an aluminum foil. In some examples, however, the current collector 2530 can include a nanotwinned metallic alloy foil or film, such as a nanotwinned Cu—Ag alloy foil. In some examples, the cathode material 2532 can be deposited or coated onto the current collector 2530. In some examples, the anode material 2512 can include carbon, such as graphite. The current collector 2510 can include a conductive film or foil, such as a copper foil. In some examples, the current collector 2510 can include a nanotwinned metallic alloy foil or film, such as a nanotwinned Cu—Ag alloy foil. In some examples, the anode material 2512 can be deposited, coated, or formed onto the previously formed current collector 2510 including nanotwinned metallic alloy material.

Although the electrochemical cells of the battery 2500 are illustrated as having a flat or laminar layer structure, substantially any shape and configuration of cells can be used. For example, the battery 2500 can include cells including layers such as a nanotwinned metallic alloy current collector that can be wound around a mandrel to form a spirally wound structure. Additionally, in some examples, the cells can vary in size and can be stacked in a configuration to achieve any shape or form of battery 2500 as desired.

Any of the materials, structure, properties, features, or aspects of the components described herein can be combined or included in any varied combination. For example, the design and shape of any component including a nanotwinned metallic alloy material is not limited in any way and can be all or a part of any component or components of an electronic device. While certain exemplary nanotwinned metallic alloy materials and processes for their formation and manufacture have been discussed, these materials can be used in any desired manner and can include any of the described material properties.

To the extent applicable to the present technology, gathering and use of data available from various sources can be used to improve the delivery to users of invitational content or any other content that can be of interest to them. The present disclosure contemplates that in some instances, this gathered data can include personal information data that uniquely identifies or can be used to contact or locate a specific person. Such personal information data can include demographic data, location-based data, telephone numbers, email addresses, TWITTER® ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data can be used to provide insights into a user's general wellness or can be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data can be governed by federal and/or state laws, such as the Health Insurance Portability and Accountability Act (HIPAA); whereas health data in other countries can be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services. In yet another example, users can select to limit the length of time mood-associated data is maintained or entirely prohibit the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

As used herein, the terms exterior, outer, interior, inner, top, and bottom are used for reference purposes only. An exterior or outer portion of a component can form a portion of an exterior surface of the component but may not necessarily form the entire exterior of outer surface thereof. Similarly, the interior or inner portion of a component can form or define an interior or inner portion of the component but can also form or define a portion of an exterior or outer surface of the component. A top portion of a component can be located above a bottom portion in some orientations of the component, but can also be located in line with, below, or in other spatial relationships with the bottom portion depending on the orientation of the component.

As used herein, the terms first and second, such when used to describe a first layer and a second layer, are used for reference only, and are not intended to indicate or imply any order or relation between the layers, material, or components, or any process including the layers, materials, or components. For example, a second layer can be provided, formed, or treated first in a process involving first and second layers. Further, in some examples, the second material can overlie the first material, while in other examples, the first material can overlie the second material. Accordingly, the terms first and second are not intended to limit the order or orientation of materials, layers, or components in any way.

Various inventions have been described herein with reference to certain specific embodiments and examples. However, they will be recognized by those skilled in the art that many variations are possible without departing from the scope and spirit of the inventions disclosed herein, in that those inventions set forth in the claims below are intended to cover all variations and modifications of the inventions disclosed without departing from the spirit of the inventions. The terms "including" and "having" come as used in the specification and claims shall have the same meaning as the term "comprising."

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. An alloy, comprising:
   copper (Cu);
   one of silver (Ag) or cobalt (Co), the alloy comprising between 0.5-2 at % of one of the silver or the cobalt; and
   crystal grains, at least 90% of the crystal grains comprising nanotwin boundaries.

2. The alloy of claim 1, wherein the crystal grains have an average spacing between nanotwin boundaries of between 2 and 5 nanometers (nm).

3. The alloy of claim 1, wherein at least 95% of the crystal grains comprise nanotwin boundaries.

4. An electronic device, comprising:
   a conductive component comprising a metallic alloy including a series of crystal grains, the metallic alloy comprising a copper (Cu) alloy, wherein the copper alloy comprises between 0.5-2 at % of one of silver (Ag) or Cobalt (Co); and
   at least 90% of the series of crystal grains comprising nanotwin boundaries.

5. The electronic device of claim 4, wherein the conductive component is an electrically conductive component.

6. The electronic device of claim 5, wherein the electrically conductive component comprises a charging receptacle.

7. The electronic device of claim 5, wherein the electrically conductive component comprises an electrical connector between two electronic components.

8. The electronic device of claim 7, wherein the two electronic components comprise printed circuit boards.

9. The electronic device of claim 4, wherein the conductive component is a thermally conductive component.

10. The electronic device of claim 9, wherein the thermally conductive component comprises a support plate.

11. The electronic device of claim 9, wherein the thermally conductive component comprises a non-planar shape and mechanically supports a component affixed to the thermally conductive component.

12. The electronic device of claim 5, further comprising a battery, the battery comprising:
    an electrochemical cell comprising an electrolyte, an anode, and a cathode; and
    a current collector electrically coupled to one of the anode or the cathode, the current collector comprising the conductive component.

13. The battery of claim 12, wherein the metallic alloy has a thickness of less than 10 microns.

14. The battery of claim 12, wherein the electrochemical cell is a lithium-ion electrochemical cell.

* * * * *